(12) United States Patent
Kanno

(10) Patent No.: US 10,782,879 B2
(45) Date of Patent: *Sep. 22, 2020

(54) MEMORY SYSTEM FOR CONTROLLING NONVOLATILE MEMORY

(71) Applicant: Toshiba Memory Corporation, Tokyo (JP)

(72) Inventor: Shinichi Kanno, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/785,860

(22) Filed: Oct. 17, 2017

(65) Prior Publication Data

US 2018/0039417 A1 Feb. 8, 2018

Related U.S. Application Data

(63) Continuation of application No. 14/949,078, filed on Nov. 23, 2015.

(30) Foreign Application Priority Data

Jul. 23, 2015 (JP) ................. 2015-145712

(51) Int. Cl.
*G06F 3/06* (2006.01)
*G11C 29/52* (2006.01)
*G06F 12/02* (2006.01)

(52) U.S. Cl.
CPC .............. *G06F 3/0604* (2013.01); *G06F 3/06* (2013.01); *G06F 3/064* (2013.01); *G06F 3/0644* (2013.01);
(Continued)

(58) Field of Classification Search
CPC ............ G06F 11/1008; G06F 11/1012; G06F 11/108; G06F 11/1068; G06F 11/1044;
(Continued)

(56) References Cited

U.S. PATENT DOCUMENTS 5,477,553 A * 12/1995 Kong .................. G06F 11/1044
714/805
8,479,080 B1 7/2013 Shalvi et al.
(Continued)

FOREIGN PATENT DOCUMENTS

EP 2 455 865 A1 5/2012
EP 3 121 718 A1 1/2017
(Continued)

OTHER PUBLICATIONS

Partial European Search Report dated May 3, 2016 in Patent Application No. 15190795.3.
(Continued)

*Primary Examiner* — James C Kerveros
(74) *Attorney, Agent, or Firm* — Oblon, McClelland, Maier & Neustadt, L.L.P.

(57) ABSTRACT

According to one embodiment, a memory system includes a nonvolatile memory including physical blocks, and a controller. The controller manages namespaces. The namespaces include at least a first namespace for storing a first type of data, and a second namespace for storing a second type of data having a lower update frequency than the first type of data. The controller allocates a first number of physical blocks as a physical resource for the first namespace, and allocates a second number of physical blocks as a physical resource for the second namespace, based on a request from a host device specifying an amount of physical resources to be secured for each of the namespaces.

15 Claims, 28 Drawing Sheets

(52) U.S. Cl.
CPC ........ *G06F 3/0679* (2013.01); *G06F 12/0246* (2013.01); *G11C 29/52* (2013.01); *G06F 2212/7202* (2013.01); *G06F 2212/7205* (2013.01); *G06F 2212/7211* (2013.01)

(58) Field of Classification Search
CPC ...... G06F 3/0604; G06F 12/0246; G06F 3/06; G06F 3/0679; G06F 3/064; G06F 2212/7211; G06F 2212/7205; G06F 2212/7202; G06F 3/0644; H03M 13/611; H03M 13/05; G11C 16/349; G11C 29/52
USPC .......................................................... 714/766
See application file for complete search history.

(56) References Cited

U.S. PATENT DOCUMENTS

| | | | |
|---|---|---|---|
| 8,621,328 B2* | 12/2013 | Franceschini | G06F 11/1012 |
| | | | 711/103 |
| 8,832,506 B2 | 9/2014 | Griffin | |
| 8,990,670 B2 | 3/2015 | Ozdemir | |
| 9,015,537 B2 | 4/2015 | Griffin | |
| 9,071,269 B2 | 6/2015 | Kipnis | |
| 9,286,207 B2* | 3/2016 | Charbouillot | G06F 12/0246 |
| 9,542,119 B2 | 1/2017 | Klein | |
| 9,953,725 B2* | 4/2018 | Ryu | G11C 29/44 |
| 2006/0282610 A1 | 12/2006 | Dariel et al. | |
| 2011/0264843 A1 | 10/2011 | Haines et al. | |
| 2012/0173831 A1 | 7/2012 | Rubio et al. | |
| 2012/0226962 A1 | 9/2012 | Franceschini | |
| 2013/0024609 A1 | 1/2013 | Gorobets et al. | |
| 2014/0325013 A1 | 10/2014 | Tamir et al. | |
| 2016/0019159 A1 | 1/2016 | Ueda et al. | |
| 2016/0313922 A1 | 10/2016 | Kojima | |

FOREIGN PATENT DOCUMENTS

| | | |
|---|---|---|
| JP | 2009-503629 A | 1/2009 |
| JP | 2013-161222 A | 8/2013 |
| WO | WO 2015/052811 A1 | 4/2015 |

OTHER PUBLICATIONS

Extended European Search Report dated Dec. 8, 2016 in patent application No. 15190795.3.

NVM Express, Inc., "NVM Express" (Revision 1. 1b), downloaded by JPO on May 17, 2018 from: http://nvmexpress.org/wp-content/uploads/NVM-Express-1_0e.pdf, Jul. 2, 2014, pp. 1,8-10, 48-50, 118, 135-137.

* cited by examiner

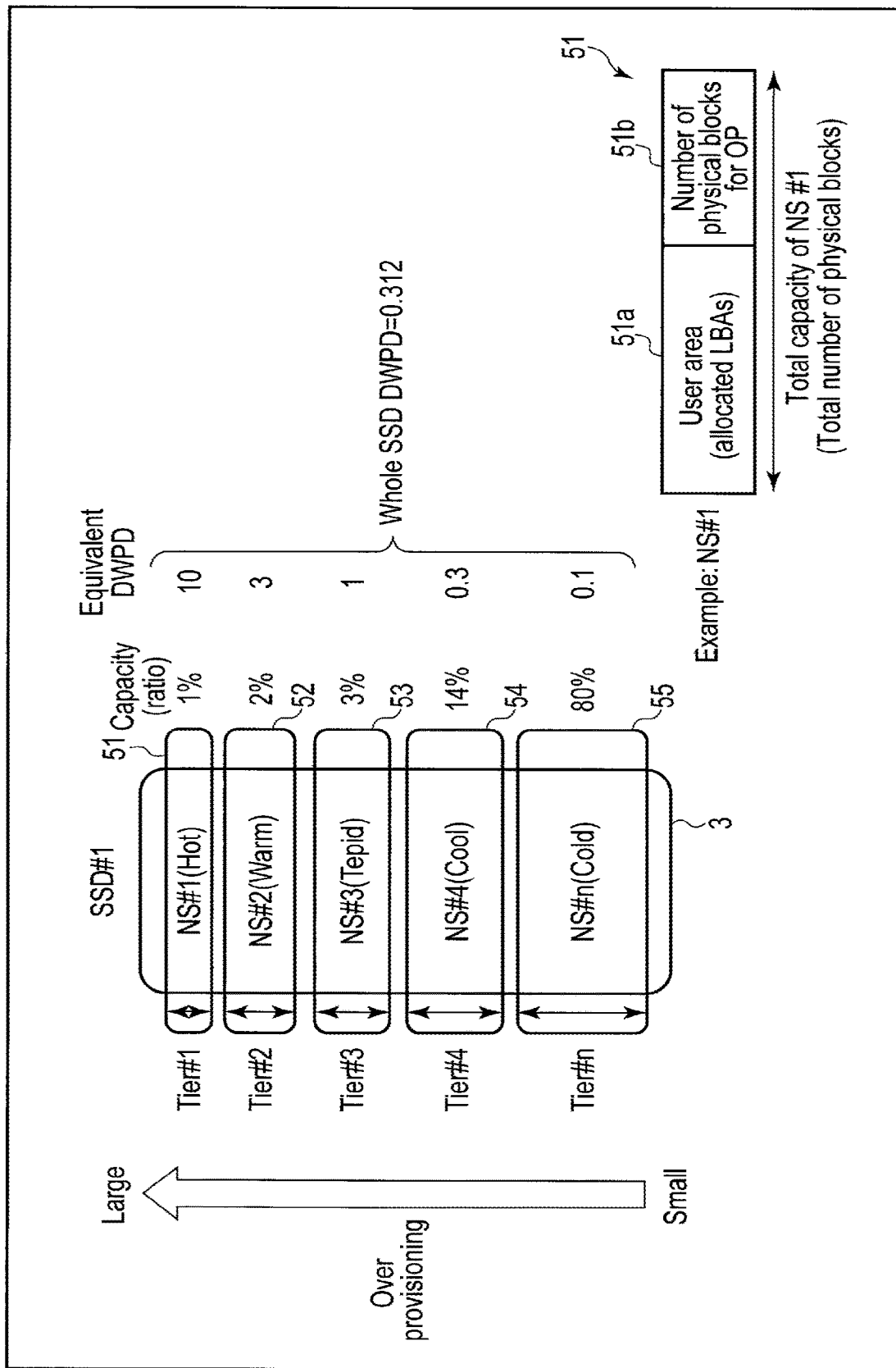
F I G. 3

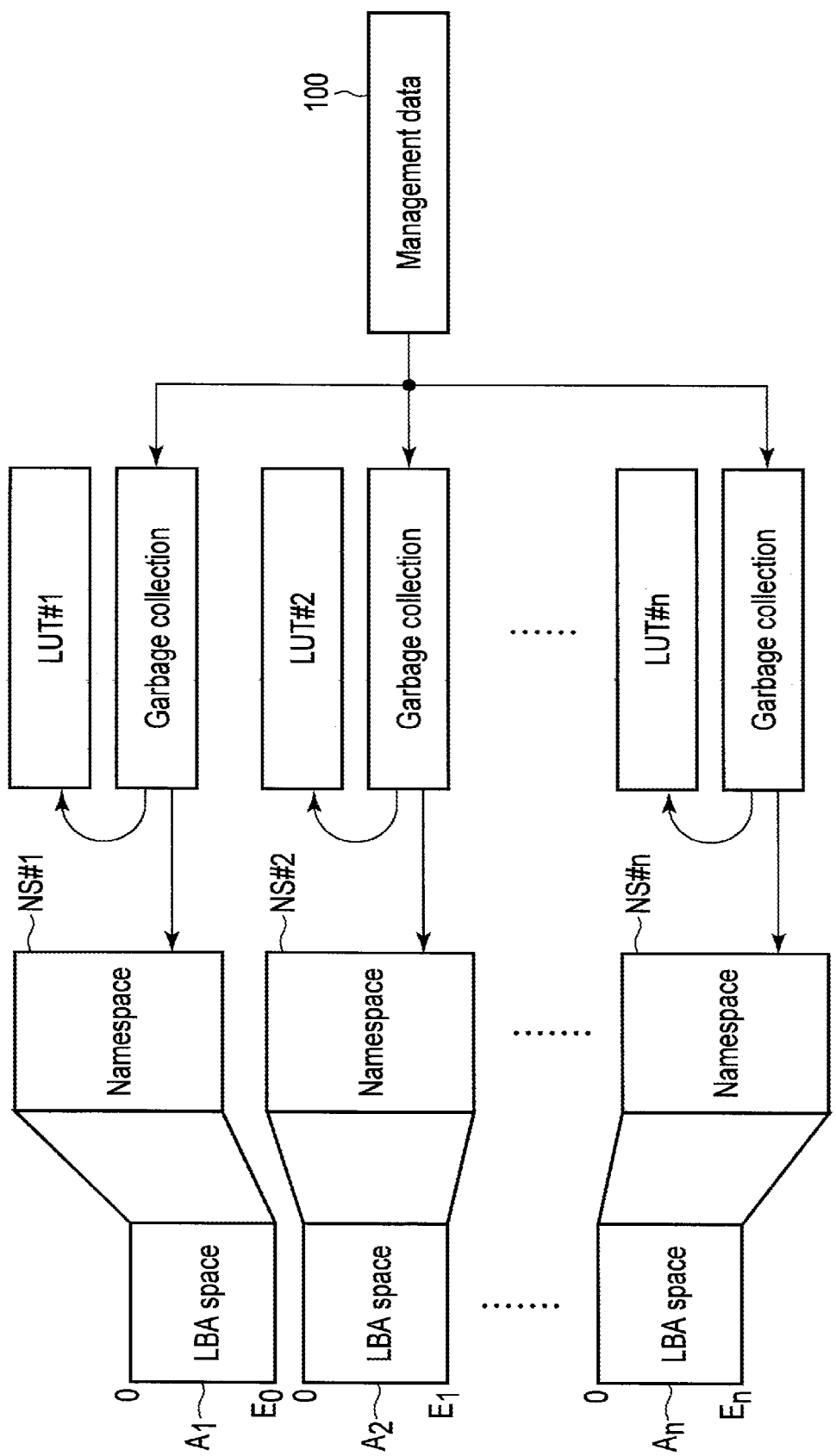
F I G. 5

Extended namespace management command

| Parameter | Explanation |
|---|---|
| Create/Delete | 0h: Create<br>1h: Delete |
| LBA range | 0~N-1 |
| Physical resource size (or size of over-provision) | Number of physical blocks to be secured (or number of physical blocks to be secured for over-provision) |
| Tier attribute (optional) | 000 : Hot<br>001 : Warm<br>010 : Tepid<br>011 : Cool<br>100 : Cold |

F I G. 6

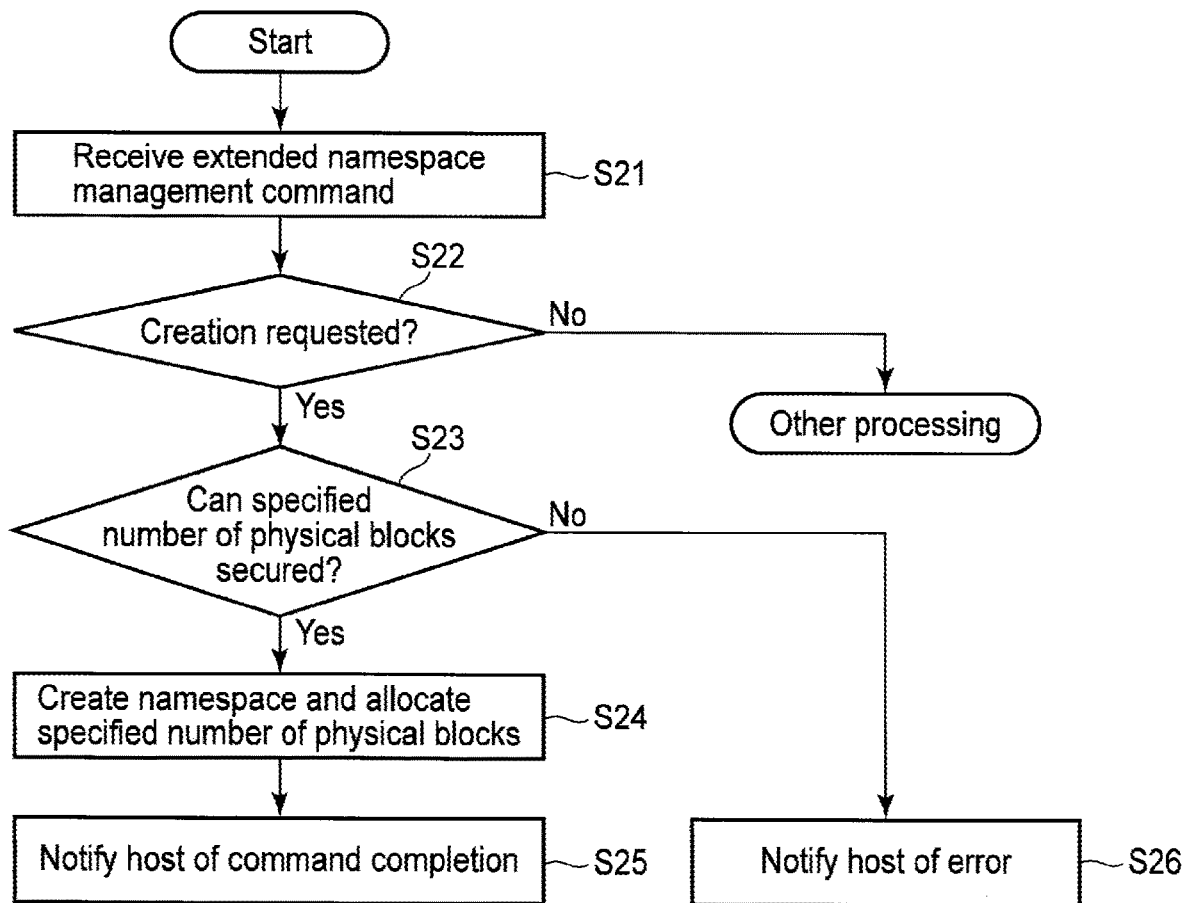
F I G. 8

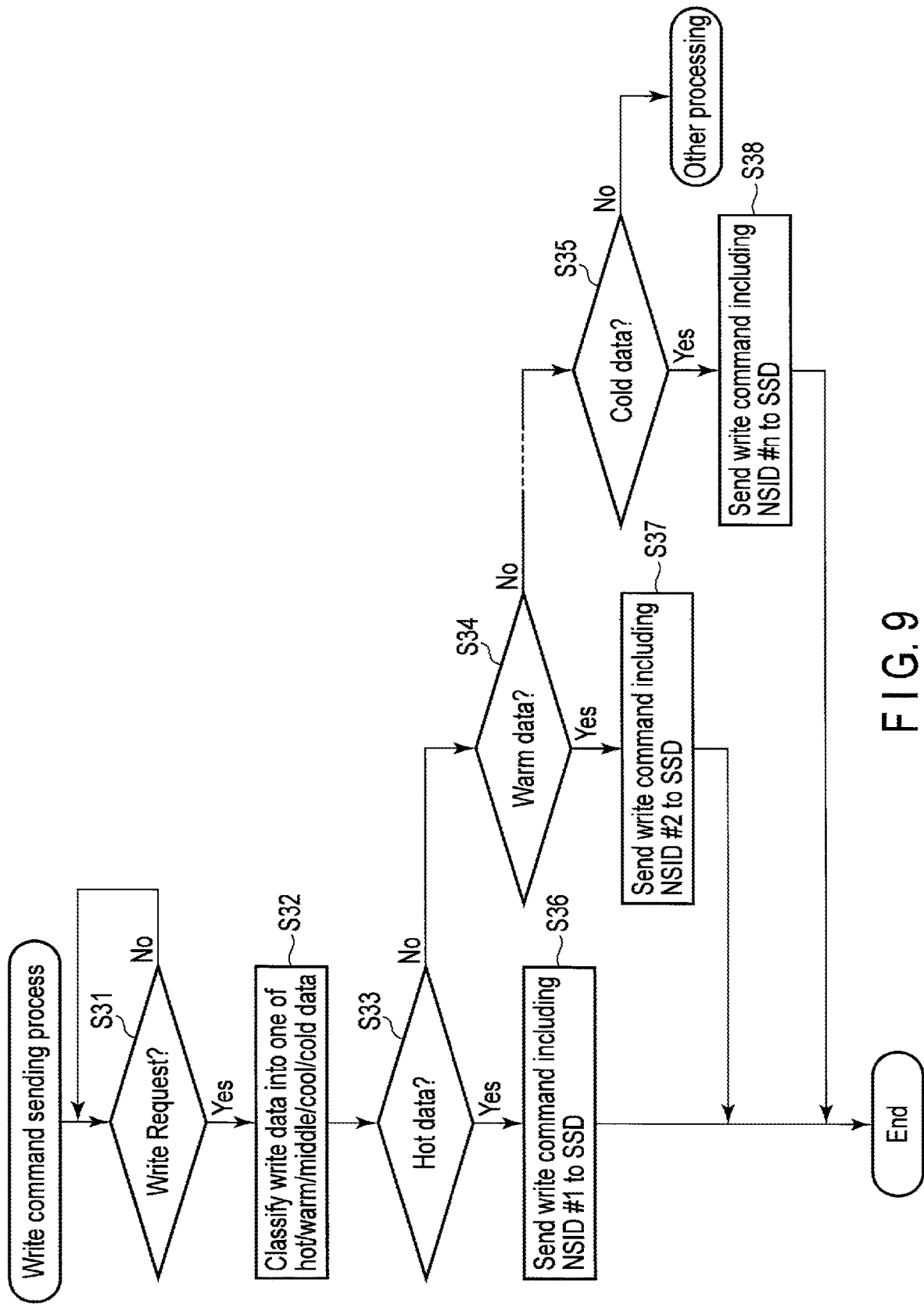
F I G. 9

Write command
| Parameter | Explanation |
|---|---|
| Starting LBA | Starting LBA of data to be written |
| Number of logical blocks | Number of logical blocks (transfer length) corresponding to data to be written |
| Namespace ID | ID of namespace to be written |
| ⋮ | ⋮ |
F I G. 10
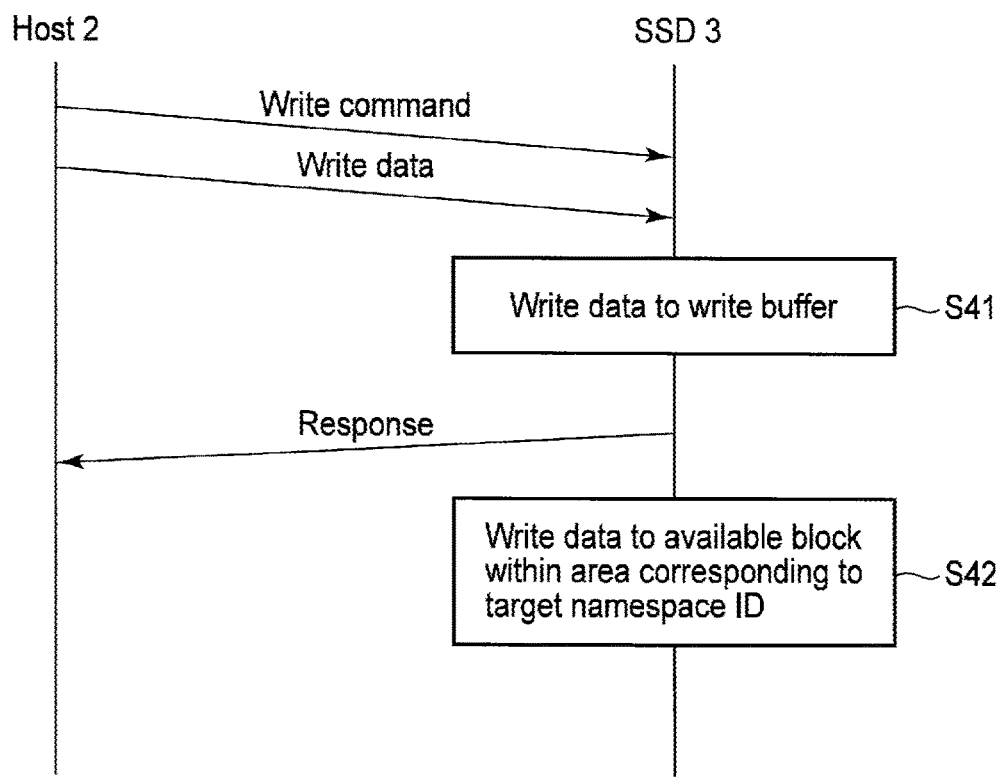
F I G. 11

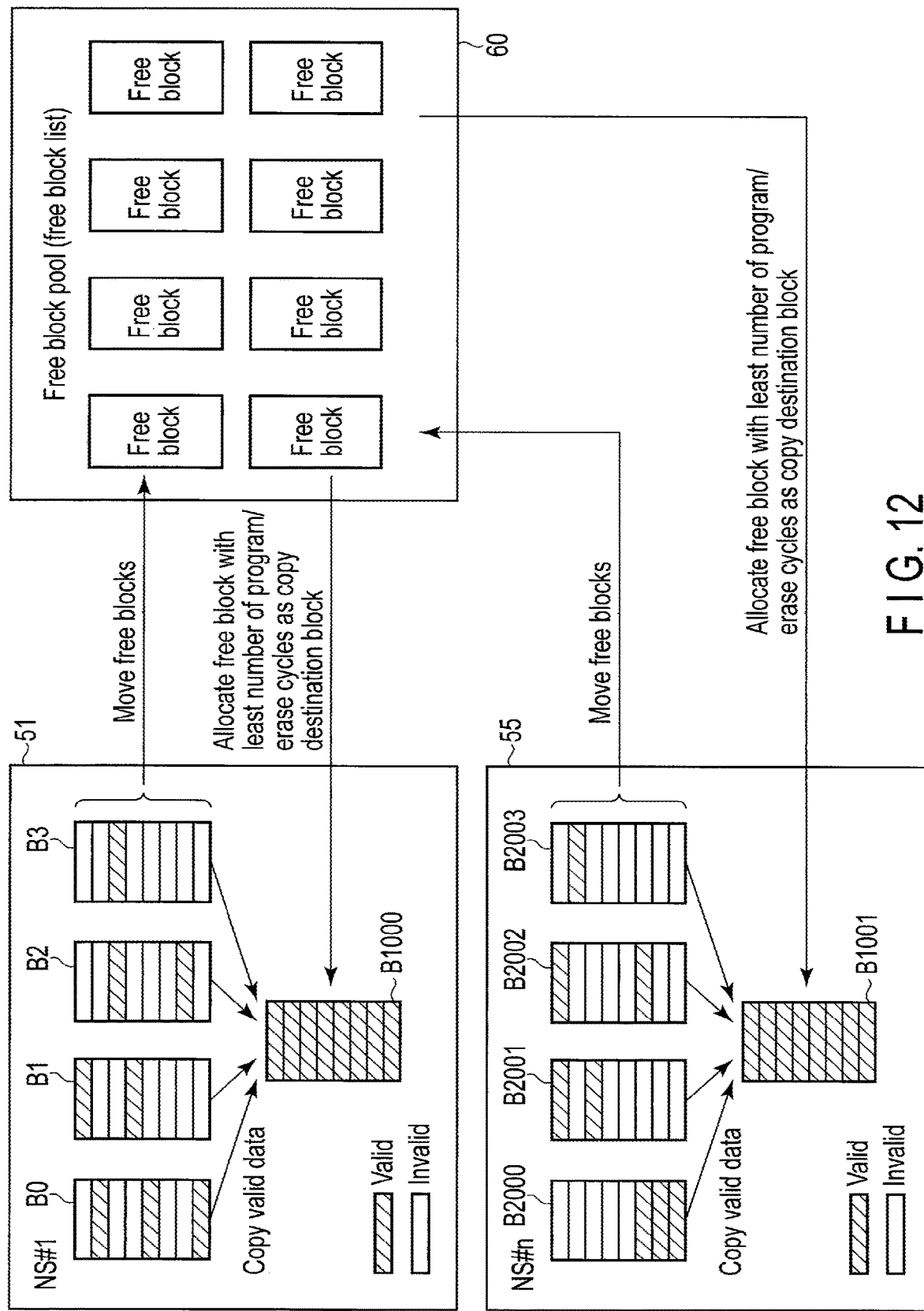
F I G. 12

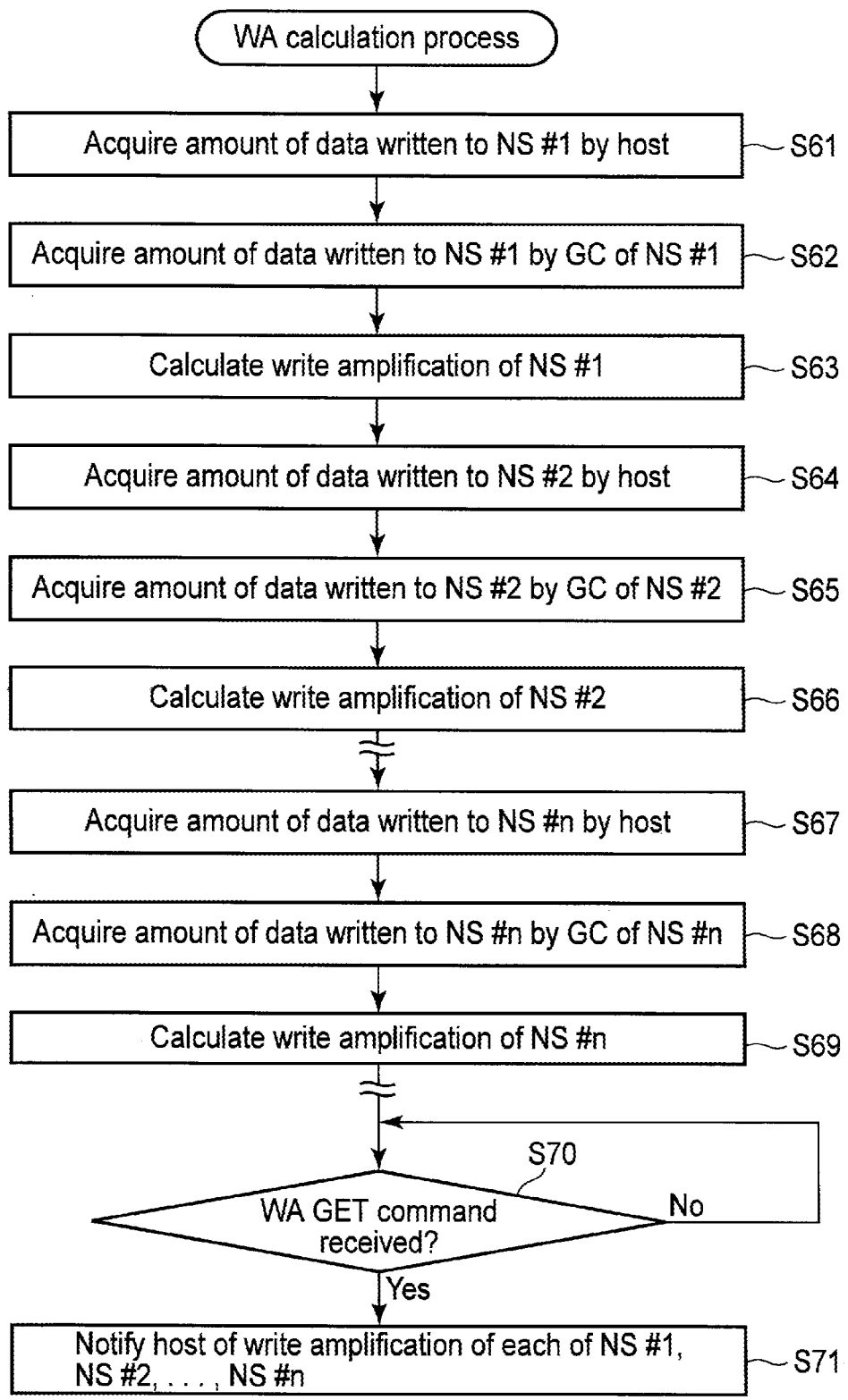
F I G. 15

Return data

| Parameter | Explanation |
|---|---|
| NS#1-WA | Write amplification of NS #1 |
| NS#2-WA | Write amplification of NS #2 |
| ⋮ | ⋮ |
| NS#n-WA | Write amplification of NS #n |

F I G. 16

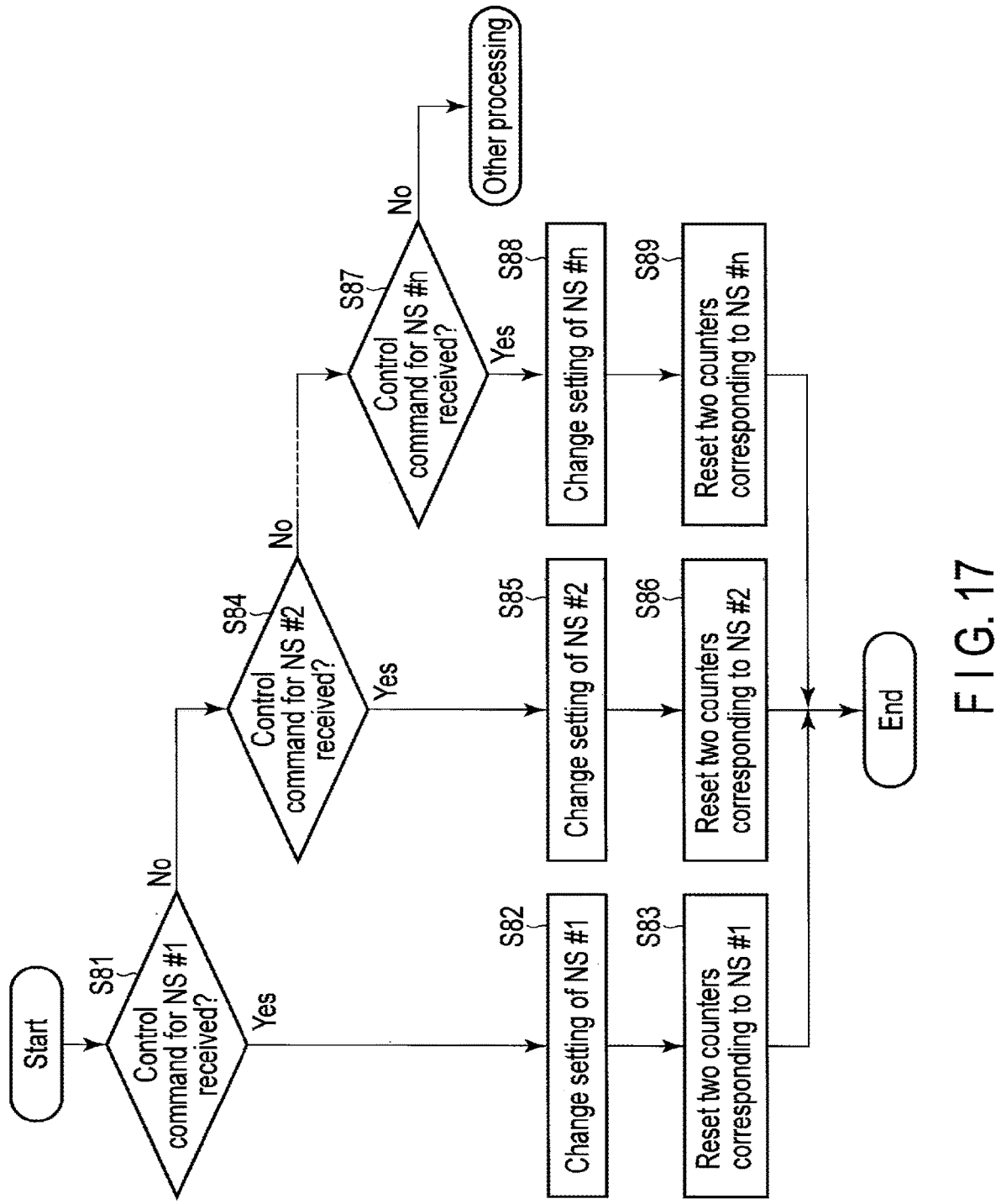
F I G. 17

Extended GC control command

| Parameter | Explanation |
|---|---|
| Namespace ID | ID of target namespace for which garbage collection should be executed |
| Amount of free blocks | Amount of free blocks which should be secured |
| Timer | Maximum time of garbage collection |
| ⋮ | ⋮ |

F I G. 18

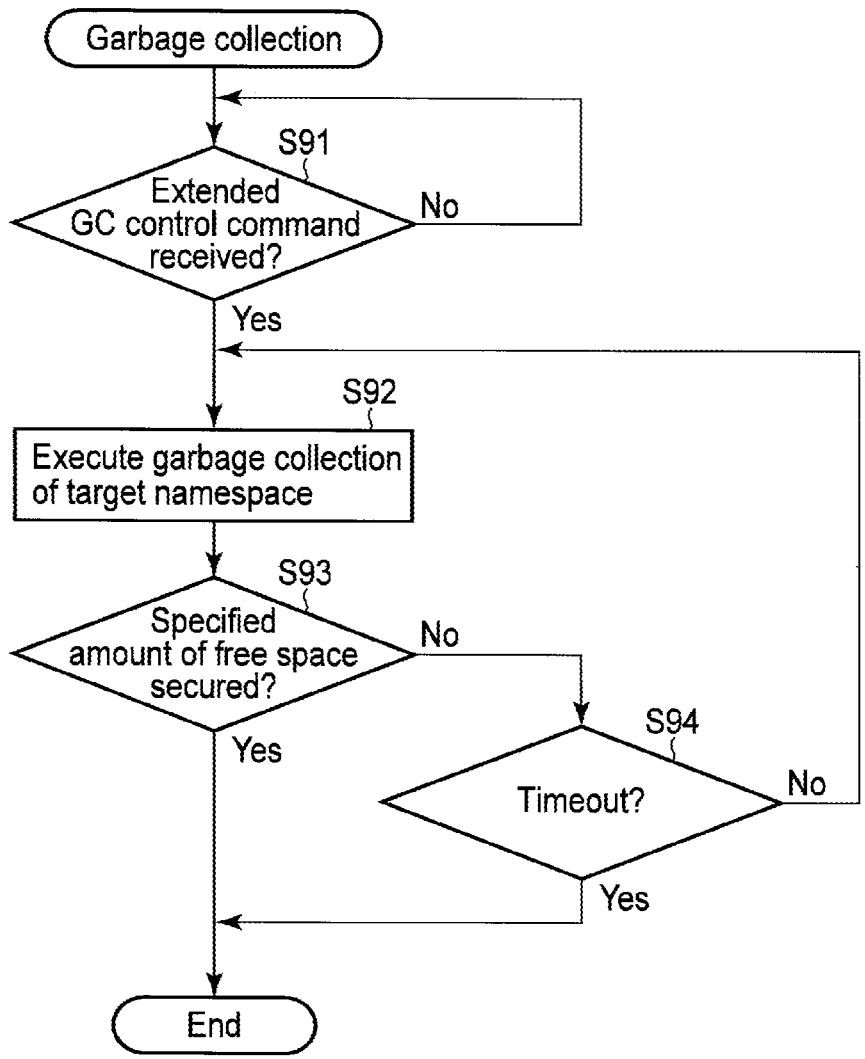
F I G. 19

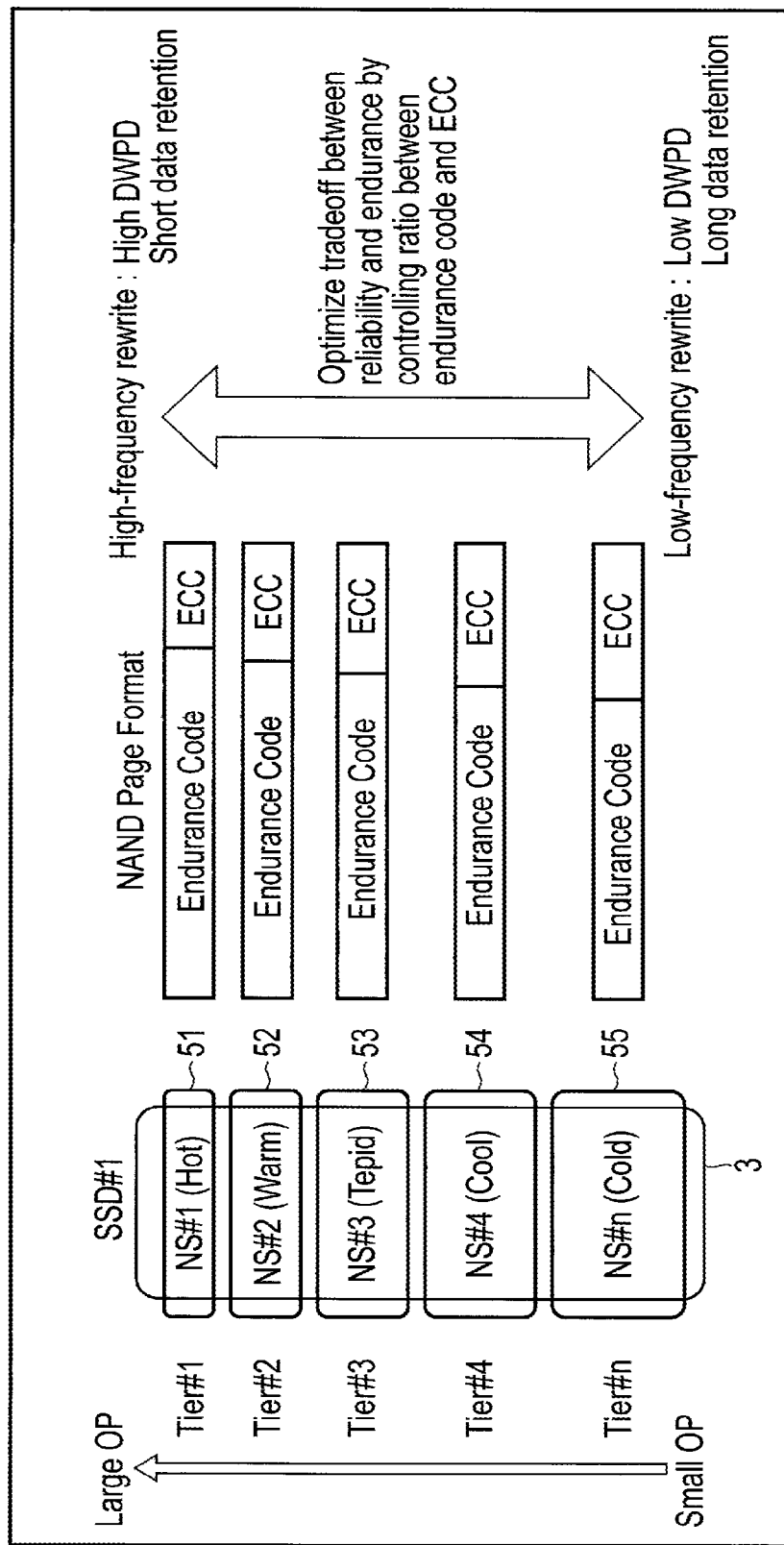
F I G. 20

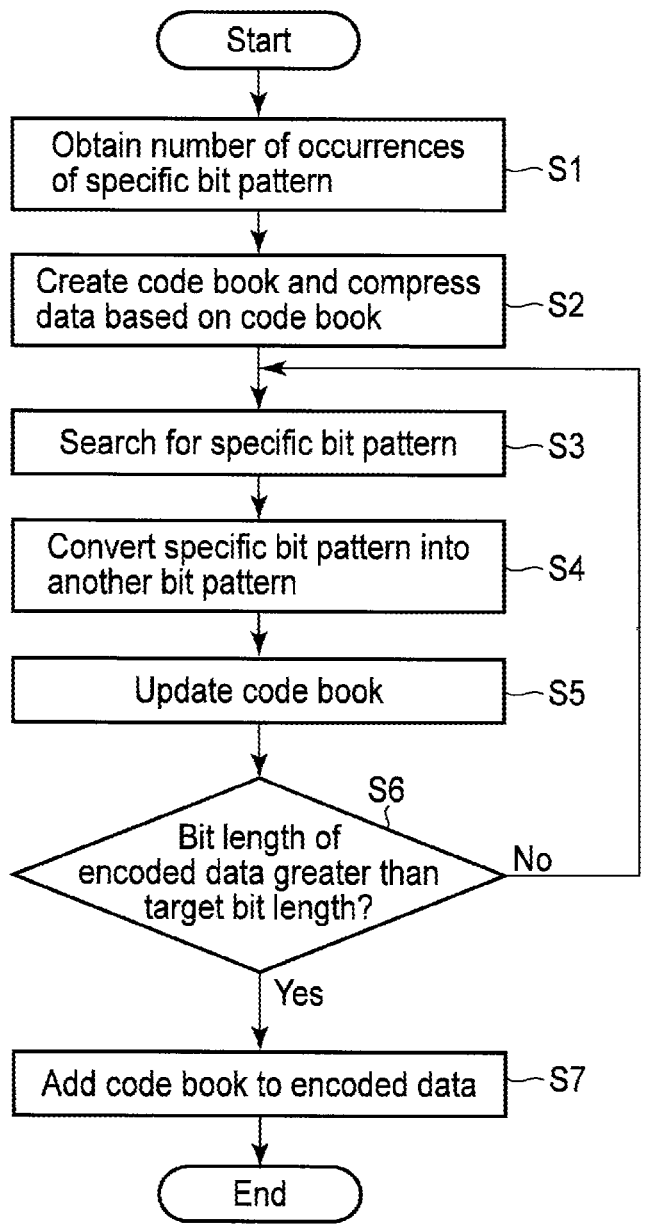
F I G. 23

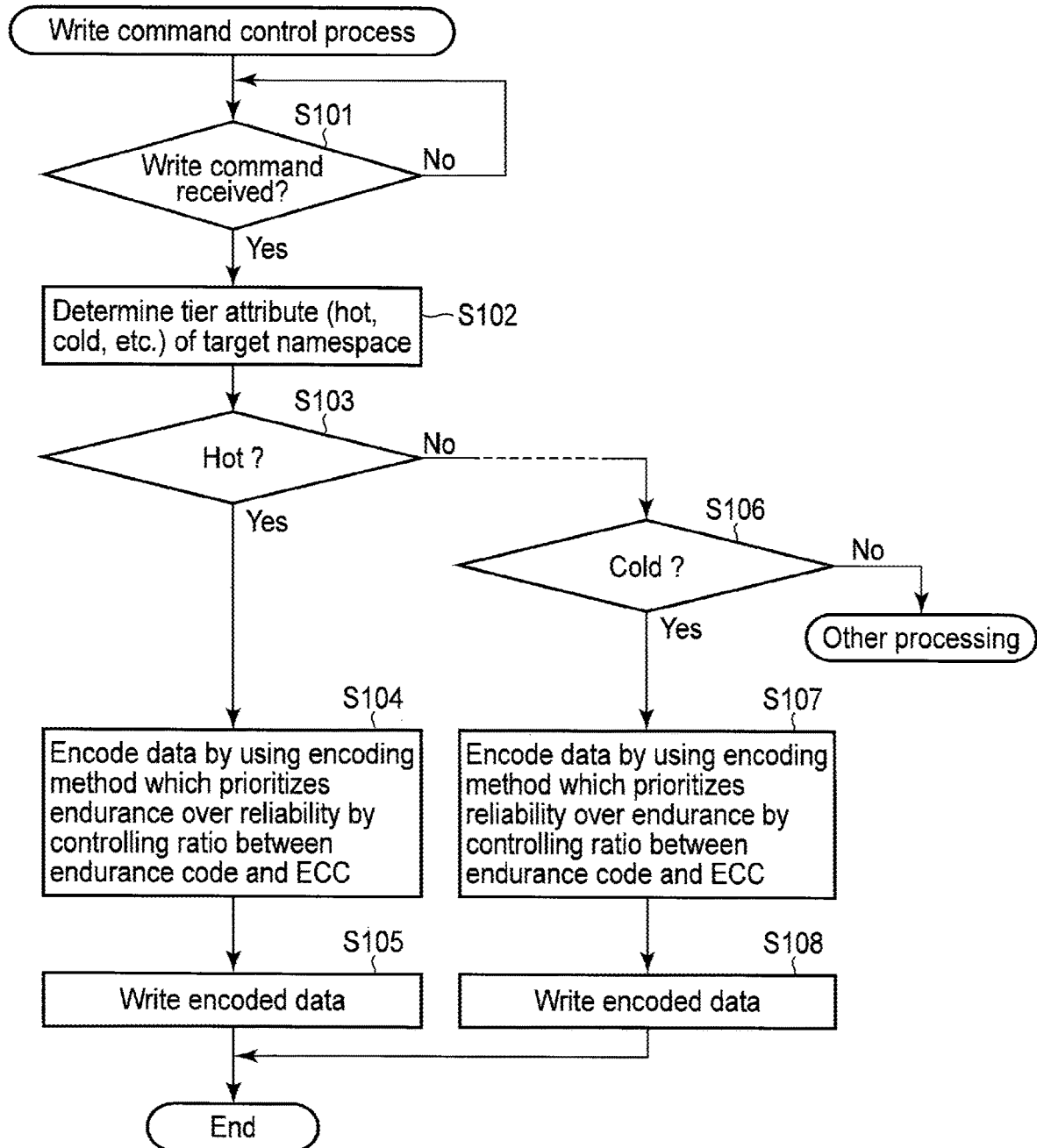
F I G. 24

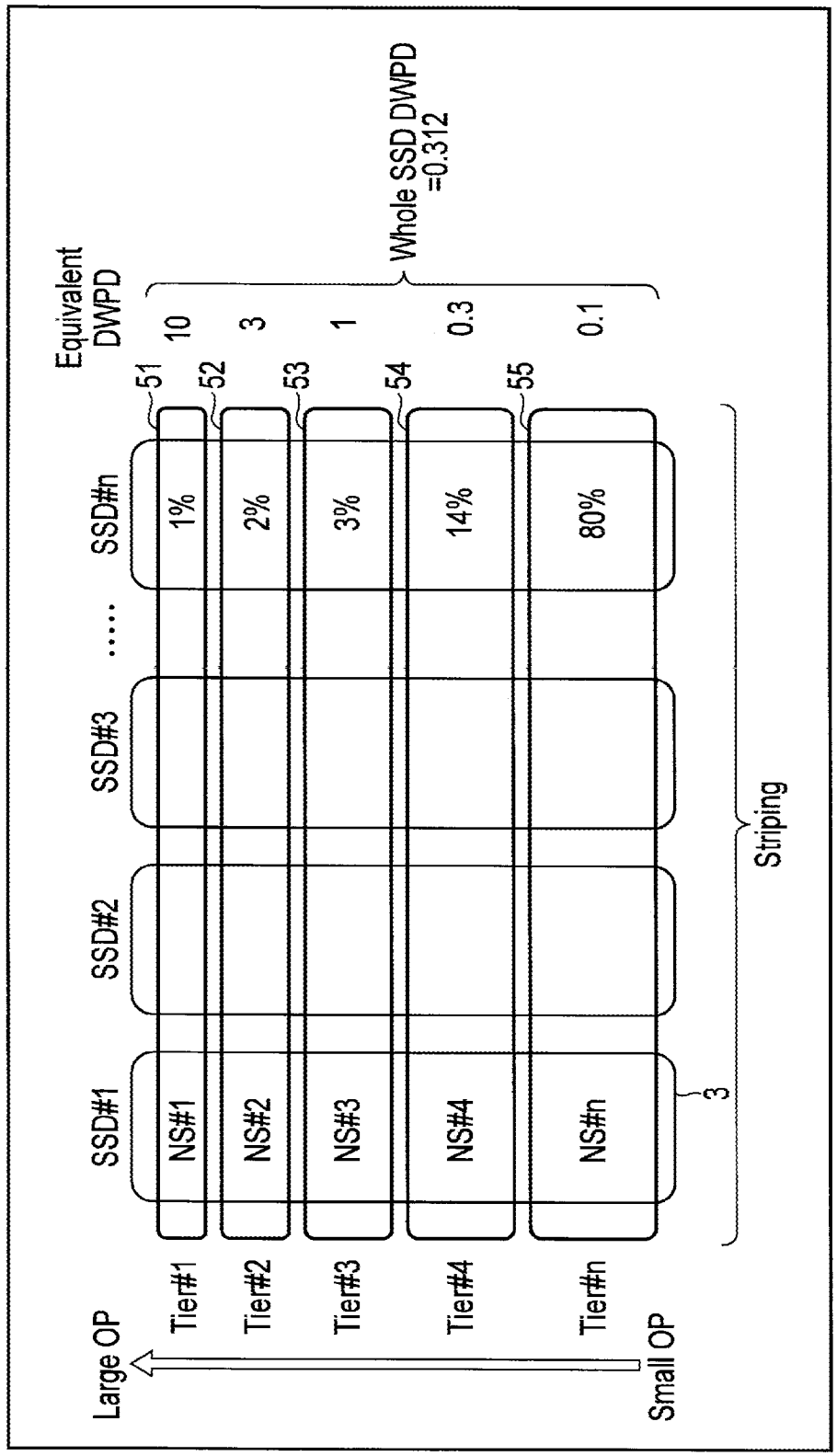
F I G. 25

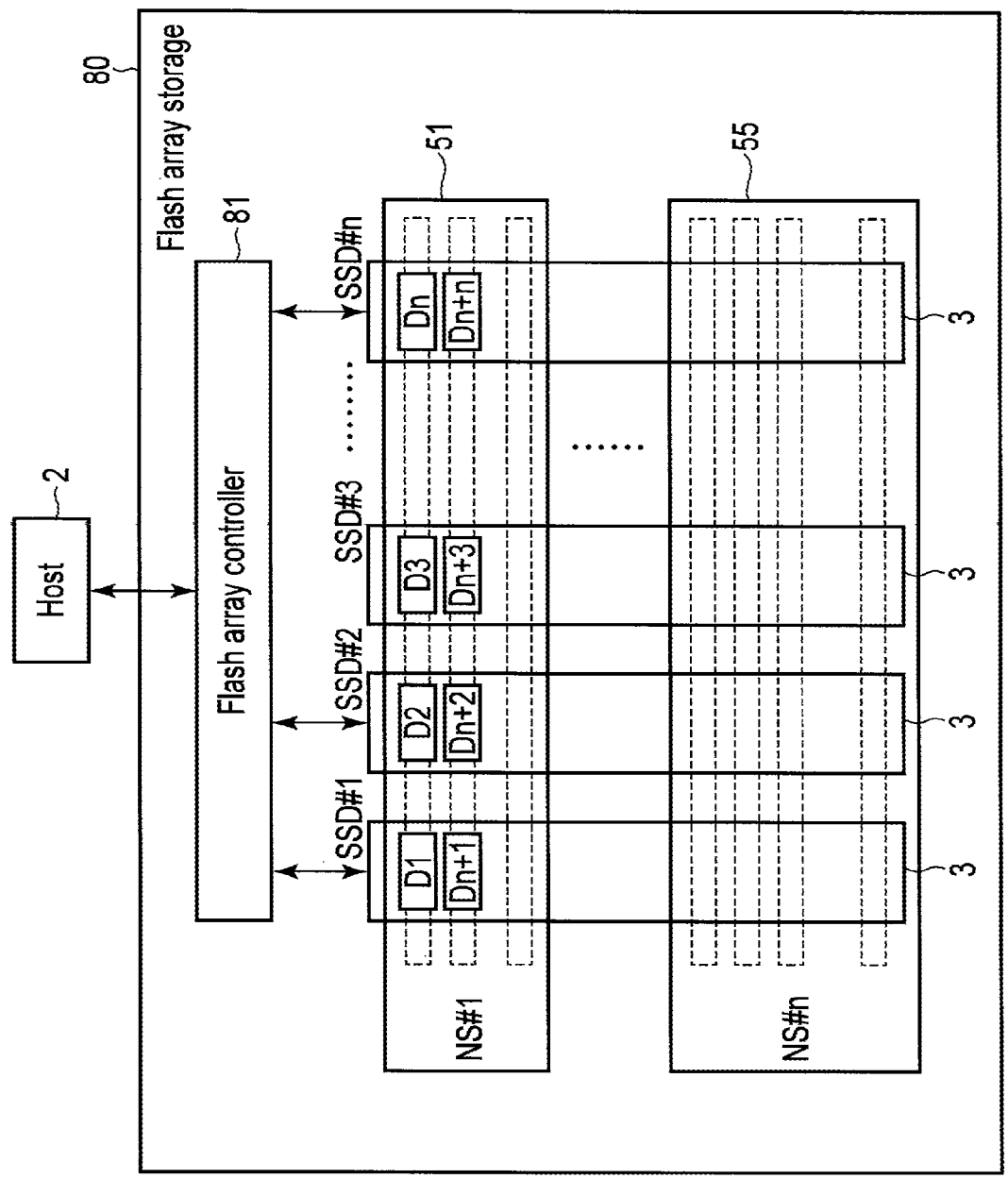
F I G. 26

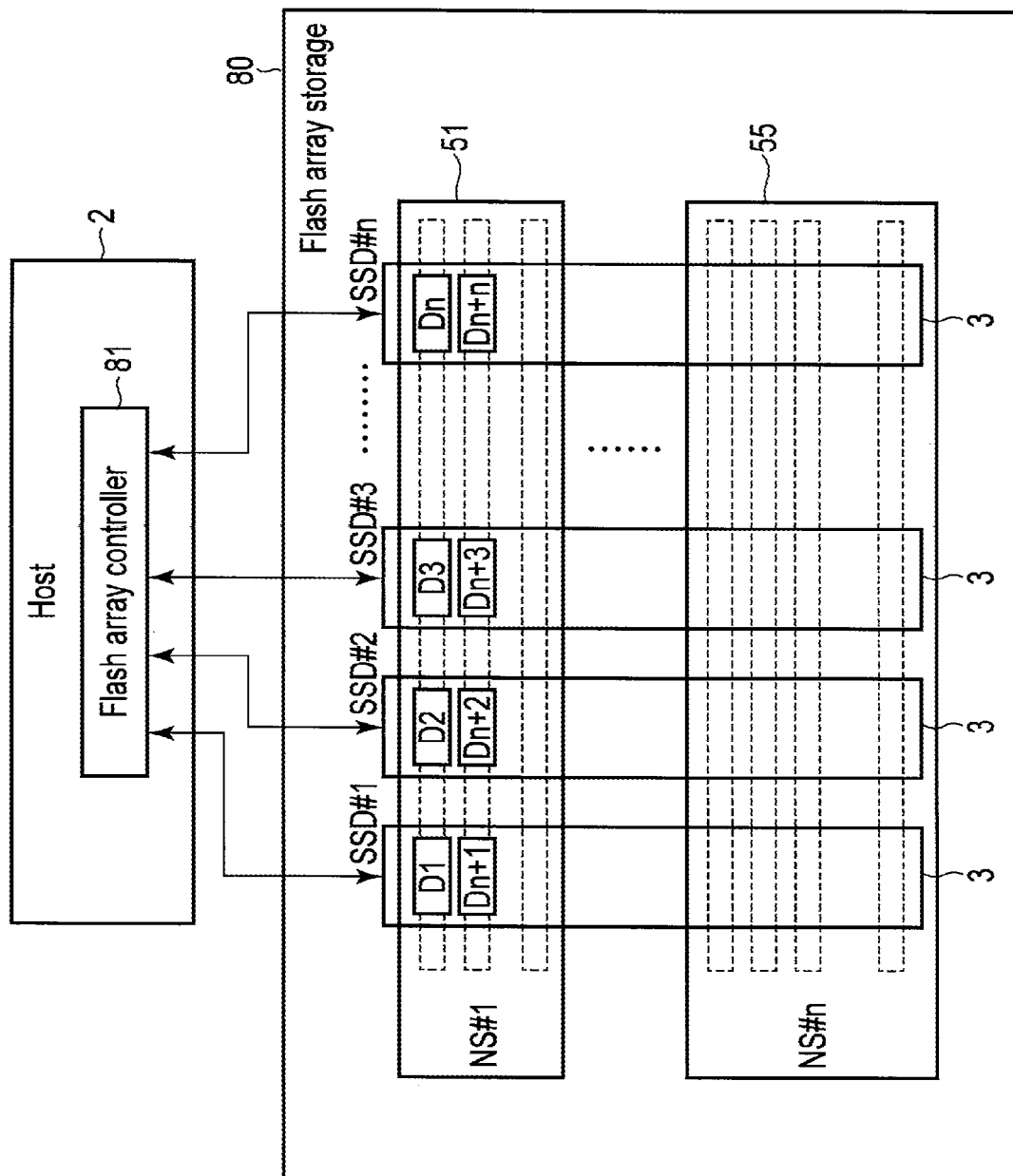
F I G. 27

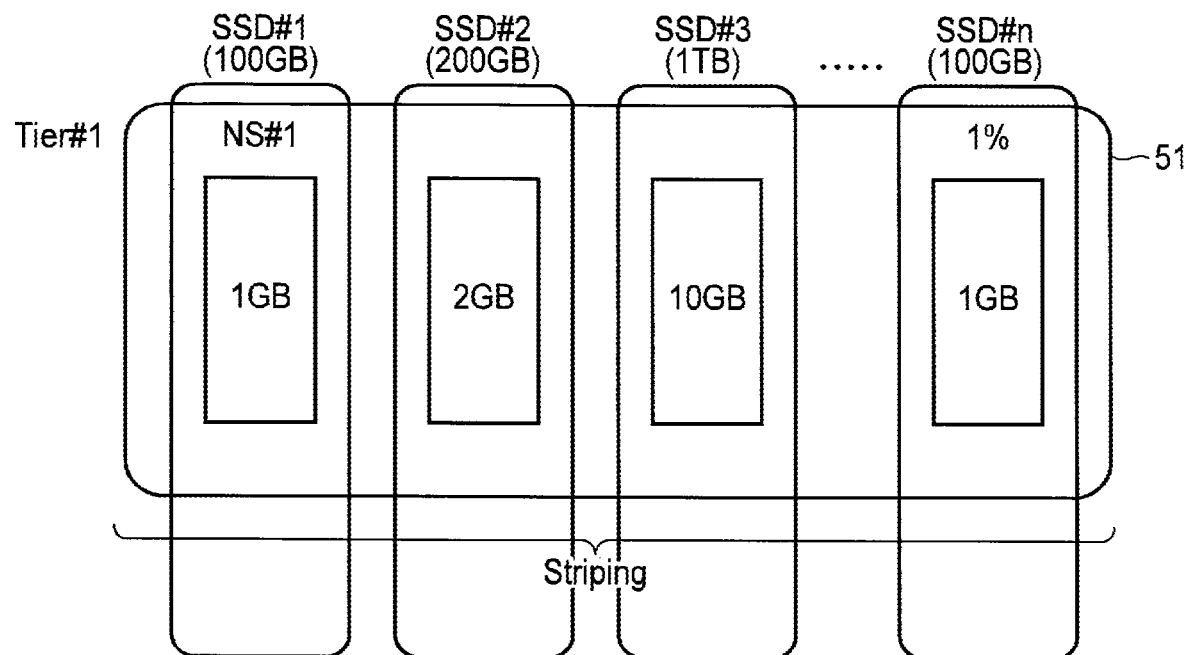
F I G. 28
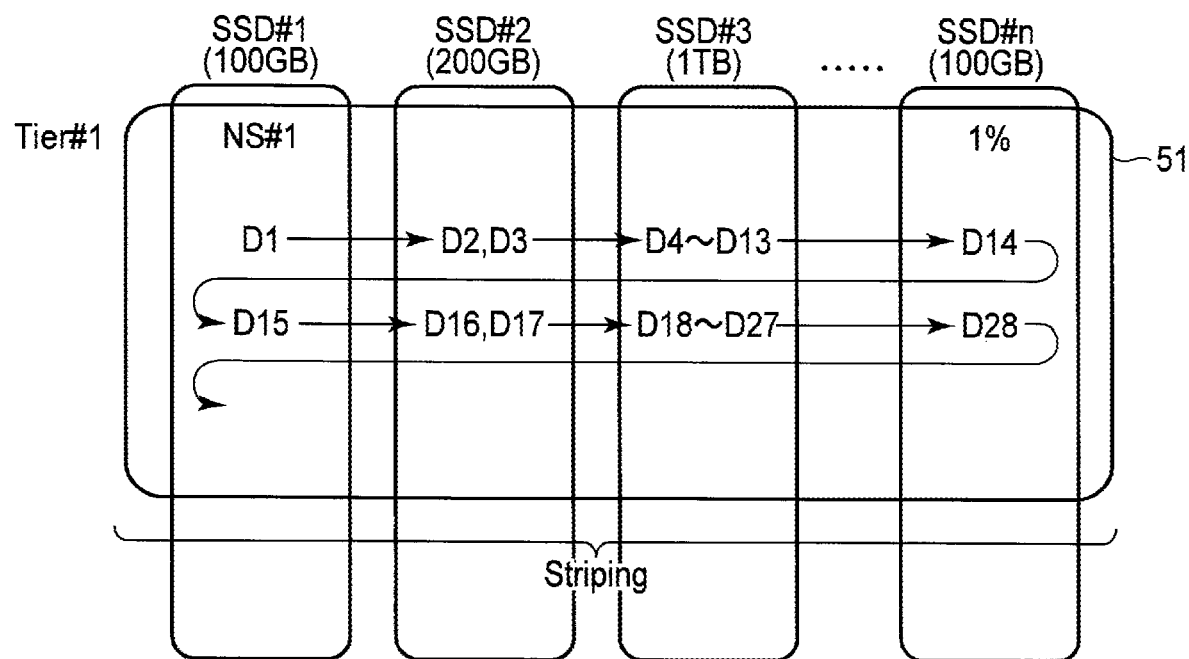
F I G. 29

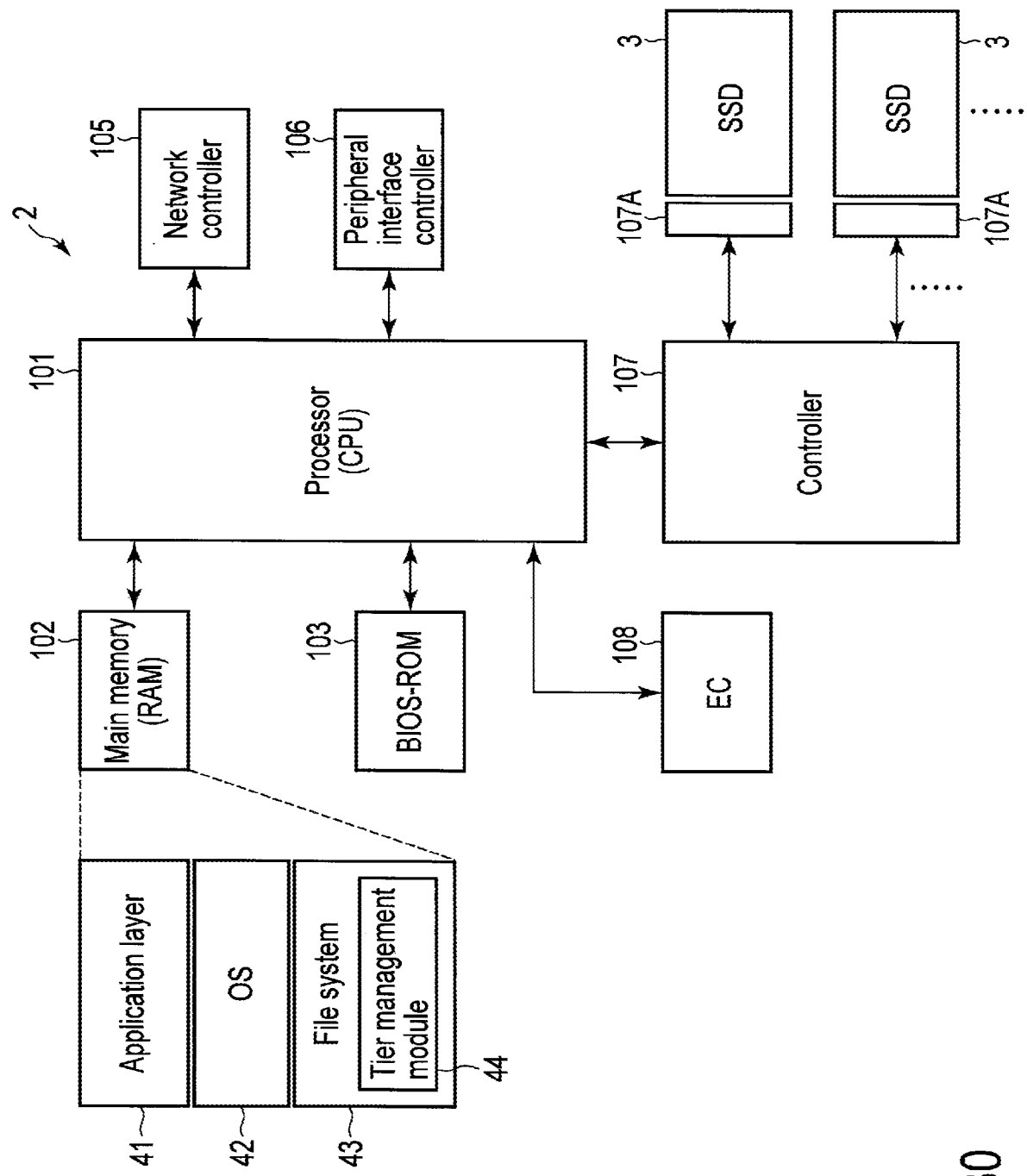
F I G. 30

000000000000000000000000000000000000000000000000000000
MEMORY SYSTEM FOR CONTROLLING NONVOLATILE MEMORY

CROSS-REFERENCE TO RELATED APPLICATIONS

This application is a continuation of U.S. application Ser. No. 14/949,078, filed Nov. 23, 2015, which is based upon and claims the benefit of priority from Japanese Patent Application No. 2015-145712, filed Jul. 23, 2015, the entire contents of each of which are incorporated herein by reference.

FIELD

Embodiments described herein relate generally to technology of controlling a nonvolatile memory.

BACKGROUND

Recently, memory systems comprising nonvolatile memories have become widespread.

As one of these memory systems, a NAND-flash technology based solid-state drive (SSD) is known. Because of their low-power-consumption and high-performance, SSDs are used as the main storage of various computers.

As the type of SSDs, the SSDs include a small-capacity, high-speed SSD such as a single-level-cell SSD (SLC-SSD), and a large-capacity SSD, such as a multi-level-cell SSD (MLC-SSD) and a triple-level-cell SSD (TLC-SSD).

Normally, in a data center, these kinds of SSDs are used selectively according to the use.

However, it becomes a cause of increasing a Total Cost of Ownership (TCO) of the data center if SSDs for dedicated use according to the type of data are employed.

BRIEF DESCRIPTION OF THE DRAWINGS

FIG. 3 is an illustration for describing a plurality of tiers which are set within the memory system of the embodiment.

FIG. 5 is an illustration for describing namespace management of the memory system of the embodiment.

FIG. 6 is an illustration for describing an extended namespace management command applied to the memory system of the embodiment.

FIG. 8 is a flowchart showing steps of a physical resource allocation process executed by the memory system of the embodiment.

FIG. 9 is a flowchart showing steps of a write command sending process executed by a host connected to the memory system of the embodiment.

FIG. 10 is an illustration for describing a write command applied to the memory system of the embodiment.

FIG. 11 is an illustration showing a process sequence of a write operation executed by the memory system of the embodiment.

FIG. 12 is an illustration for describing a garbage collection operation and a copy destination free block allocation operation which are executed by the memory system of the embodiment.

FIG. 15 is a flowchart showing steps of a write amplification (WA) calculation process executed by the memory system of the embodiment.

FIG. 16 is an illustration showing an example of return data transmitted to a host from the memory system of the embodiment.

FIG. 17 is a flowchart showing steps of a counter reset process executed by the memory system of the embodiment.

FIG. 18 is an illustration showing an extended garbage collection control command which is applied to memory system of the embodiment.

FIG. 19 is a flowchart showing steps of a garbage collection operation executed by the memory system of the embodiment.

FIG. 20 is an illustration for describing a process of controlling the ratio between an endurance code and an ECC, which is executed by the memory system of the embodiment.

FIG. 23 is a flowchart showing steps of the encoding process executed by the memory system of the embodiment.

FIG. 24 is a flowchart showing steps of a write control process executed by the memory system of the embodiment.

FIG. 25 is an illustration showing the structure of a flash array applied to the memory system of the embodiment.

FIG. 26 is an illustration showing the structure of a flash array storage of the embodiment.

FIG. 27 is an illustration showing another structure of a flash array storage of the embodiment.

FIG. 28 is an illustration for describing the relationship between a total capacity of each SSD within the flash array storage of the embodiment and the amount of physical resources which should be allocated to each tier.

FIG. 29 is an illustration for describing a write operation of the flash array storage of the embodiment.

FIG. 30 is block diagram showing a configuration example of a host of the embodiment.

DETAILED DESCRIPTION

In general, according to one embodiment, a memory system includes a nonvolatile memory comprising a plurality of physical blocks, and a controller electrically connected to the nonvolatile memory. The controller manages a plurality of namespaces for storing a plurality of kinds of data having different update frequencies. The plurality of namespaces include at least a first namespace for storing a first type of data, and a second namespace for storing a second type of data having a lower update frequency than the first type of data. The controller allocates a first number of physical blocks as a physical resource for the first namespace, and allocates a second number of physical blocks as a physical resource for the second namespace, based on a request from a host device specifying an amount of physical resources to be secured for each of the namespaces.

Figure 1:
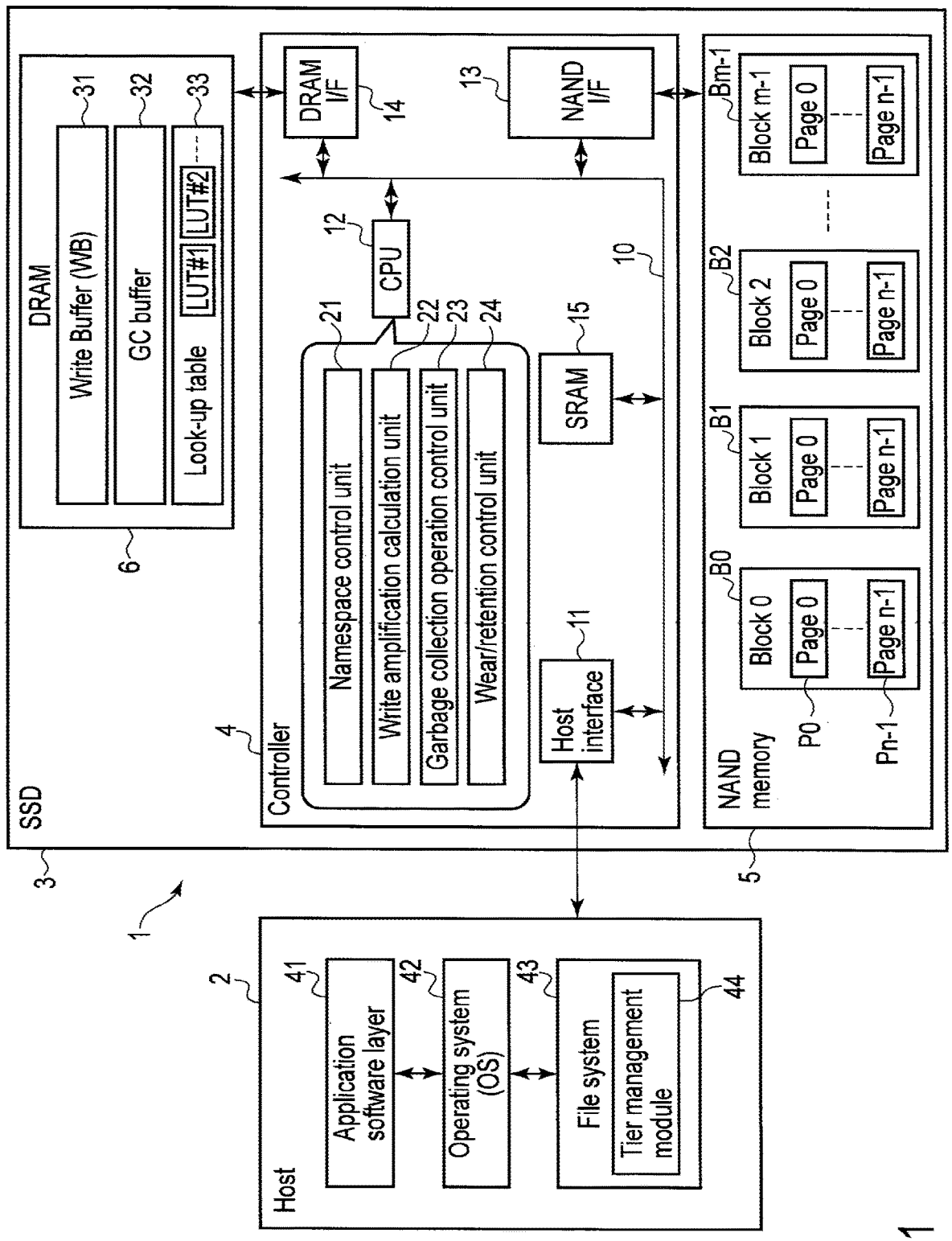
FIG. 1 is a block diagram showing a configuration example of a memory system according to one embodiment.

First, referring to FIG. 1, a configuration of an information processing system 1 including a memory system according to one embodiment will be described.

This memory system is a semiconductor storage device configured to write data to a nonvolatile memory, and read data from the nonvolatile memory. The memory system is realized as, for example, a NAND-flash solid-state drive (SSD) 3.

The information processing system 1 includes a host (a host device) 2, and the SSD 3. The host 2 is an information processing apparatus such as a server or a personal computer.

The SSD 3 may be used as a main storage of an information processing apparatus which functions as the host 2. The SSD 3 may be accommodated in the information processing apparatus or connected to the information processing apparatus via a cable or a network.

As an interface for interconnecting the host 2 and the SSD 3, SCSI, Serial Attached SCSI (SAS), ATA, Serial ATA (SATA), PCI Express (PCIe), Ethernet (registered trademark), Fiber Channel, etc., may be used.

The SSD 3 comprises a controller 4, a nonvolatile memory (a NAND memory) 5, and a DRAM 6. Although the type of the NAND memory 5 is not limited, it may include a plurality of NAND flash memory chips.

The NAND memory 5 includes a number of NAND blocks (physical blocks) B0 to Bm-1. Each of physical blocks B0 to Bm-1 serves as an erase unit. The physical block may be referred to as a "block" or "erase block".

Physical blocks B0 to Bm-1 include many pages (physical pages). That is, each of physical blocks B0 to Bm-1 includes pages P0 to Pn-1. In the NAND memory 5, reading and writing of data are executed by the page. Erasing of data is executed by the physical block.

The controller 4 is electrically connected to the NAND memory 5, which is a nonvolatile memory, via a NAND interface 13 such as a Toggle and ONFI. The controller 4 may function as a flash translation layer (FTL) configured to execute management of data in the NAND memory 5 (data management), and management of blocks in the NAND memory 5 (block management).

The data management includes, for example, (1) management of mapping information showing the relationship between logical block addresses (LBAs) and physical addresses, and (2) a process for concealing the read/write per page and the erase operation per block. The management of mapping between LBAs and the physical addresses is executed by using a look-up table (LUT) 33. The physical address corresponding to a certain LBA indicates the storage location within the NAND memory 5 to which the data of this LBA is written. The physical address includes a physical page address and a physical block address. The physical page address is assigned to all pages and the physical block address is assigned to all physical blocks.

Writing of data to a page is enabled only once per erase cycle.

Accordingly, the controller 4 maps the write (overwrite) to the same LBA to a different page in the NAND memory 5. That is, the controller 4 writes the data to this different page. Further, the controller 4 updates the look-up table (LUT) 33 and associates this LBA with the different page, and also invalidates the original page (the old data with which this LBA was associated).

The block management includes management of bad blocks, wear leveling, garbage collection, etc. The wear leveling is an operation for leveling the program/erase cycles for each of the physical blocks.

The garbage collection is an operation for creating a free space in the NAND memory 5. The garbage collection operation copies all items of valid data in several target blocks in which the valid data and invalid data are mixed to another block (for example, a free block), in order to increase the number of free blocks in the NAND memory 5. Further, the garbage collection operation updates the look-up table (LUT) 33, and maps each of the LBAs of the copied valid data to a correct physical address. A block which includes only the invalid data as the valid data has been copied to another block is opened as a free block. In this way, this block can be used again after erasure.

The host 2 sends a write command to the SSD 3. The write command includes a logical address (a starting logical address) of the write data (that is, the data to be written), and a transfer length. In this embodiment, while an LBA is used as the logical address, in the other embodiment, an object ID may be used as a logical address. The LBA is represented by a serial number assigned to a logical sector (size: 512 bytes, for example). The serial number starts with zero. The controller 4 of the SSD 3 writes the write data specified by the starting logical address (starting LBA) and the transfer length in the write command to a physical page of a physical block in the NAND memory 5. Further, the controller 4 maps the LBAs corresponding to the written data to physical addresses corresponding to physical storage locations at which this data is written by updating the look-up table (LUT) 33.

Next, a configuration of the controller 4 will be described.

The controller 4 includes a host interface 11, a CPU 12, the NAND interface 13, a DRAM interface 14, an SRAM 15, etc. The CPU 12, the NAND interface 13, the DRAM interface 14, and the SRAM 15 are interconnected via a bus 10.

The host interface 11 receives various commands from the host 2 (a write command, a read command, an extended namespace management command, an extended garbage collection control command, an UNMAP command, etc.).

The write command requests the SSD 3 to write data specified by this write command. The write command includes an LBA of the first logical block to be written, and the transfer length (the number of logical blocks). The read command requests the SSD 3 to read data specified by this read command. The read command includes an LBA of the first logical block to be read, and the transfer length (the number of logical blocks).

The extended namespace management command is an extended command of an ordinary namespace management command.

Generally, what host software can specify is only the number of logical block addresses (LBAs) for a namespace, and the number of physical blocks (a nonvolatile memory capacity) which should actually be allocated to this namespace cannot be specified. That is, normally, the size of the namespace is based on the number of LBAs requested in that namespace creation operation. In an ordinary SSD, the number of physical blocks allocated for the namespace is determined by a controller within the SSD. For example, if the size corresponding to the number of LBAs required for the namespace is 90 MB, and the capacity of one physical block is 100 MB, an ordinary SSD controller may allocate one physical block for this namespace. Alternatively, if the size corresponding to the number of LBAs required for the namespace is 120 MB, and the capacity of one physical block is 100 MB, the ordinary SSD controller may allocate two physical blocks for this namespace. However, with such an SSD-dependent physical block allocation method, host software cannot request the SSD to create individual namespaces having different features (endurance).

The extended namespace management command can specify not only the number of logical block addresses (LBAs) for a namespace to the SSD 3, but also the number of physical blocks which should be allocated for this namespace to the SSD 3. That is, the extended namespace management command includes a parameter indicative of the amount of physical resources (the number of physical blocks) which should be secured for the namespace to be created. The extended namespace management command enables the host 2 (the host software) to secure a sufficient number of physical blocks suitable for a workload in the host 2 for each of the namespaces. Normally, the more the number of physical blocks allocated to the namespace is, the more the endurance of the namespace can be increased. Accordingly, by using the extended namespace management command, the host software can create each of namespaces having different features (endurance).

The extended garbage collection control command is an extended command of a host-initiated garbage collection command for controlling the garbage collection operation of the SSD 3 by the host 2. The extended garbage collection control command can specify the namespace to be garbage-collected to the SSD 3. That is, the extended garbage collection control command includes a parameter indicative of a target namespace for which the garbage collection is to be executed.

The CPU 12 is a processor configured to control the host interface 11, the NAND interface 13, the DRAM interface 14, and the SRAM 15. The CPU 12 executes a command process, etc., for processing various commands from the host 2 in addition to a process of the aforementioned FTL.

These FTL process and command process may be controlled by firmware executed by the CPU 12. The firmware causes the CPU 12 to function as a namespace control unit 21, a write amplification calculation unit 22, a garbage collection operation control unit 23, and a wear/retention control unit 24.

The namespace control unit 21 has a multi-namespace management function for managing multiple namespaces. The namespace corresponds to a kind of area within the NAND memory 5, which is a nonvolatile memory. The namespace control unit 21 creates multiple namespaces based on requests for creating the namespaces from the host 2, respectively. In other words, the namespace control unit 21 logically divides the NAND memory 5 into a plurality of areas (namespaces), on the basis of each of requests for creating the namespaces from the host 2. The host 2 can request the SSD 3 to create each of namespaces by using the aforementioned extended namespace management command. The namespace control unit 21 allocates one or more physical blocks whose number has been specified by the host 2 with respect to these individual areas (namespaces). These areas (namespaces) are used to store several kinds of data having different update frequencies, respectively.

For example, data of the type which is frequently updated (hot data) is written to a specific area (tier) for storing the hot data. The hot data may be referred to as dynamic data. Data of the type whose frequency of update is low (cold data) is written to another specific area (tier) for storing the cold data. The cold data may be referred to as non-dynamic data or static data.

That is, while the SSD 3 is a single storage device physically, areas within the SSD 3 serve as storages of different tiers.

These areas are associated with the namespaces, respectively. Accordingly, by merely associating the hot data with an ID of a specific namespace and associating the cold data with an ID of another specific namespace, the host software can easily specify the areas (tiers) to which these kinds of data should be written.

If an environment is that the hot data and the cold data are mixed in the same physical block, the write amplification may be significantly increased.

This is because in a physical block in which the hot data and the cold data are mixed, while only a part of the data in the physical block is invalidated early by the update of the hot data, the remaining data portion (the cold data) in this physical block may be kept in a valid state for a long time.

The write amplification (WA) is defined as follows:

$$WA = \text{(Total amount of data written to SSD)}/\text{(Total amount of data written to SSD from host)}$$

The total amount of data written to SSD, above, corresponds to the sum of the total amount of data written to the SSD from the host and the total amount of data written to the SSD internally by the garbage collection, etc.

An increase in the write amplification (WA) leads to an increase in the number of times of rewrites (the number of program/erase cycles) of each of the physical blocks in the SSD 3. That is, the greater the write amplification (WA) is, the faster the program/erase cycles of the physical block reaches its upper limit. This causes degradation in the endurance and life of the SSD 3.

If the physical block is filled with only the hot data, it is very likely that all of data in this block will be invalidated relatively early by the update of those data. Accordingly, this block can be reused by simply deleting the block without executing the garbage collection.

Meanwhile, if the physical block is filled with only the cold data, all of the data in this block is kept in the valid state for a long time. Accordingly, it is very probable this block will not become a target of garbage collection.

In the present embodiment, several kinds of data having different update frequencies are written to different areas (different namespaces). For example, the hot data is written to an area associated with a certain namespace (NS #1), and the cold data is written to another area associated with another specific namespace (NS # n). Accordingly, a situation in which the hot data and the cold data are mixed in the same physical block can be prevented from occurring. This enables the frequency of executing the garbage collection operation to be reduced, and as a result, the write amplification can be reduced.

Further, in the present embodiment, the namespace control unit 21 allocates a desired number of physical blocks to the areas (namespaces) individually, on the basis of a request from the host 2 specifying the number of physical blocks to be secured for each of the namespaces.

For example, when the host 2 demands a new namespace to be created, the host 2 sends an extended namespace management command including a parameter indicative of the number of physical blocks which should be secured for the target namespace to the SSD 3. The namespace control unit 21 creates the namespace (NS #1), and allocates physical blocks whose number is specified by the parameter to this namespace (the area associated with this namespace).

The host 2 repetitively sends the extended namespace management command to the SSD 3 while updating the value of the parameter indicative of the number of physical blocks which should be secured for the target namespace. As a result, a plurality of namespaces (areas) are created, and the NAND memory 5 is logically divided into these areas.

Accordingly, it is possible to optimally allocate the physical resources (the number of physical blocks) of the NAND memory 5 to multiple areas (multiple tiers), on the basis of the sizes (the number of LBAs) of individual areas and the endurance which should be set for each of these areas.

The write amplification calculation unit 22 calculates the write amplification of each of the namespaces (each of the areas), not the write amplification of the entire SSD 3. In this way, the write amplification calculation unit 22 can provide the write amplification corresponding to each namespace (each area) to the host 2.

The garbage collection operation control unit 23 executes the garbage collection operation per namespace (per area), thereby preventing the hot data and the cold data from being mixed in the same physical block. More specifically, when the garbage collection operation control unit 23 receives an extended garbage collection control command from the host 2, the garbage collection operation control unit 23 selects physical blocks, which are the target of the garbage collection, from the physical blocks which are allocated to the target namespace specified by the extended garbage collection control command. Further, the garbage collection operation control unit 23 executes the garbage collection operation of copying the valid data from the target physical blocks to a copy destination free block.

Further, the garbage collection operation control unit 23 manages these free blocks created by the garbage collection operation executed for each of the namespaces as shared free blocks shared among these namespaces. That is, these free blocks are shared among the namespaces. The garbage collection operation control unit 23 selects a free block having the least number of program/erase cycles from the free blocks. Further, the garbage collection operation control unit 23 allocates the selected free block to a copy destination free block in an area corresponding to the target namespace described above.

Normally, the program/erase cycles of a free block created by the garbage collection operation of an area for cold data are far less than those of a free block created by the garbage collection operation of an area for hot data. This is because once a certain amount of cold data has been written to an area for cold data, in most cases, this cold data is not frequently updated or rarely updated. Meanwhile, the number of program/erase cycles of a free block created by the garbage collection operation of an area for hot data is commonly relatively high. Accordingly, the above-mentioned operation of allocating a free block having the least number of program/erase cycles to a copy destination free block enables the block with a small number of program/erase cycles used in the area for cold data to be automatically allocated to an area for hot data.

The wear/retention control unit 24 executes an operation for optimizing a tradeoff between reliability (data retention) and endurance (DWPD value) by controlling the ratio between a code for reducing the wear of a memory cell and an error correction code (ECC). In this way, it is possible to increase the endurance of an area for hot data, and also to extend the data retention (retention time of written data) of an area for cold data.

The NAND interface 13 is a NAND controller configured to control the NAND memory 5 under the control of the CPU 12.

The DRAM interface 14 is a DRAM controller configured to control the DRAM 6 under the control of the CPU 12.

A part of a storage area of the DRAM 6 may be used as a write buffer (NB) 31 for temporarily storing data to be written to the NAND memory 5. Further, the storage area of the DRAM 6 may be used as a GC buffer 32 for temporarily storing data which is moved during the garbage collection (GC) operation. Furthermore, the storage area of the DRAM 6 may be used for storing the above-mentioned look-up table 33. The look-up table 33 may be divided into a plurality of look-up tables (LUT #1, LUT #2, . . . ) corresponding to the namespaces, respectively, so that the garbage collection (GC) operation independent for each of the namespaces can be executed.

Next, a configuration of the host 2 will be described.

The host 2 is an information processing apparatus which executes various programs. Programs which are executed by the information processing apparatus include an application software layer 41, an operating system 42, and a file system 43.

As is generally known, the operating system 42 is software configured to manage the entire host 2, control the hardware within the host 2, and execute the control so that an application can use the hardware and the SSD 3.

The file system 43 is used for controlling the operation (creation, saving, update, deletion, etc.) of a file. For example, ZFS, Btrfs, XFS, ext4, NTFS, etc., may be used as the file system 42. Alternatively, a file object system (for example, Ceph Object Storage Daemon), or a key value store system (for example Rocks DB) may be used as the file system 42.

Various application software threads run on the application software layer 41. Examples of the application software threads are client software, database software, virtual machine, etc.

When the application software layer 41 needs to send a request such as a read command or a write command to the SSD 3, the application software layer 41 sends the request to the OS 42. The OS 42 sends that request to the file system 43. The file system 43 translates that request into a command (a read command, a write command, etc.). The file system 43 sends the command to the SSD 3. When a response from the SSD 3 is received, the file system 43 sends that response to the OS 42. The OS 42 sends that response to the application software layer 41.

In the present embodiment, the host 2 smartly manages and controls the SSD 3 by using the above-described extended namespace management command, extended garbage collection control command, etc. For example, a case where a tier management module 44 of the file system 43 needs to create a namespace (an area) for hot data and a namespace (an area) for cold data is assumed. The tier management module 44 sends an extended namespace management command including a parameter indicative of the number of physical blocks which should be allocated to the namespace (area) for hot data to the SSD 3. When a response including an ID of this namespace is received from the SSD 3, the tier management module 44 manages the ID of this namespace as a namespace ID for hot data. Next, the tier management module 44 sends an extended namespace management command including a parameter indicative of the number of physical blocks which should be allocated to the namespace (area) for cold data to the SSD 3. When a response including an ID of this namespace is received from the SSD 3, the tier management module 44 manages the ID of this namespace as a namespace ID for cold data.

When it is necessary to write a certain kind of hot data to the SSD 3, the tier management module 44 sends a write command including a namespace ID for hot data to the SSD 3. When it is necessary to write a certain kind of cold data to the SSD 3, the tier management module 44 sends a write command including a namespace ID for cold data to the SSD 3.

When it is necessary to read a certain kind of hot data, the tier management module 44 sends a read command including a namespace ID for hot data to the SSD 3. When it is necessary to read a certain kind of cold data, the tier management module 44 sends a read command including a namespace ID for cold data to the SSD 3.

Figure 2:
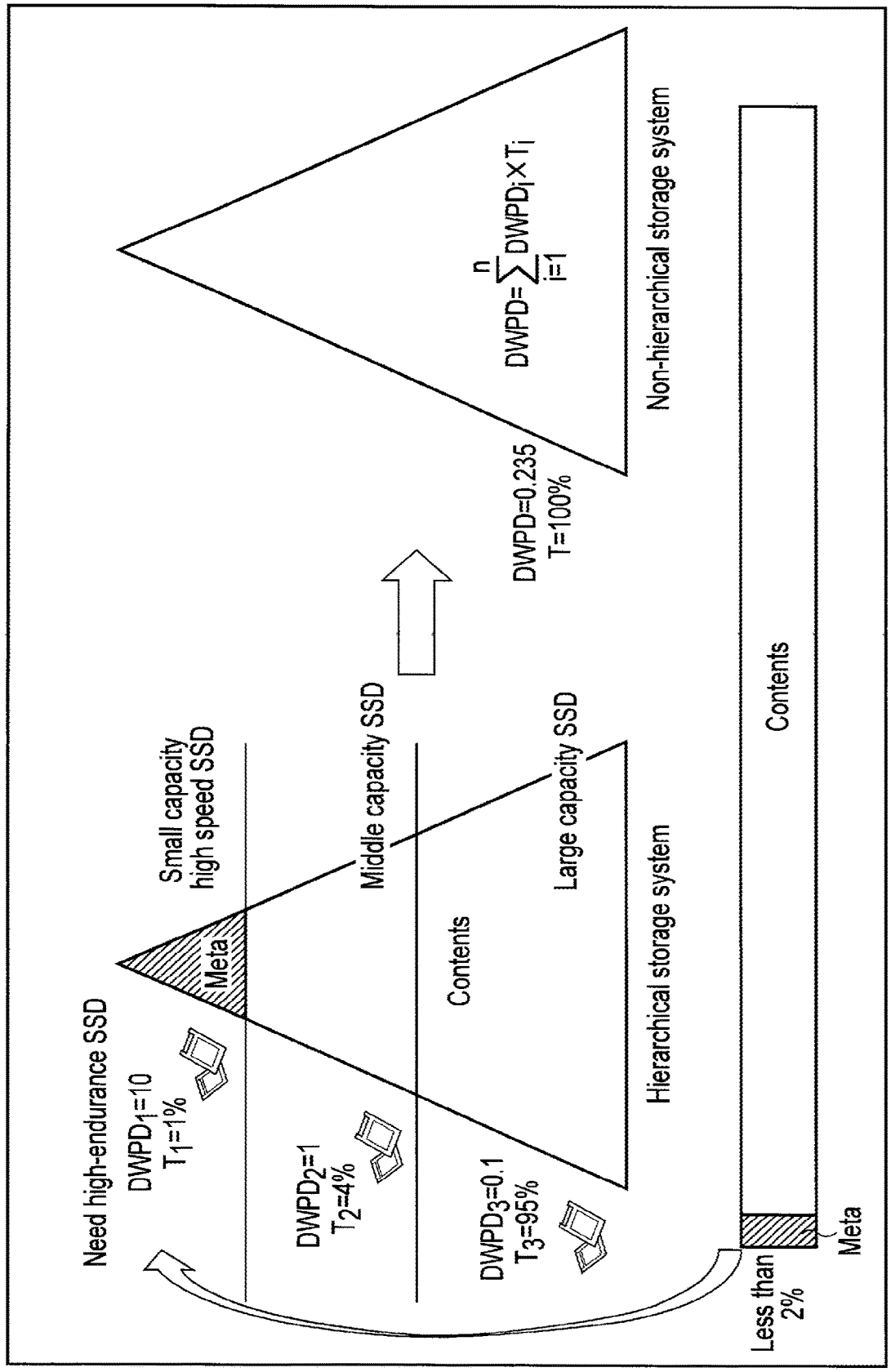
FIG. 2 is an illustration for describing the relationship between an ordinary hierarchical storage system and a non-hierarchical storage system.

FIG. 2 shows the relationship between an ordinary hierarchical storage system and a non-hierarchical storage system.

In the hierarchical storage system shown on the left side of FIG. 2, three types of SSDs are used suitably according to the purpose. The SSD for tier T1 is a small-capacity, high-speed SSD. The small-capacity, high-speed SSD may be, for example, an SLC-SSD which stores one-bit information per memory cell. Accordingly, the SSD for tier T1 is an expensive SSD.

The SSD for tier T1 is used as a storage for data having high frequency of access (read write), that is, data which is frequently updated, for example. Examples of data whose frequency of access is high include metadata of a file system. The metadata includes various kinds of management information such as a storage location of data in a file, the date and time this data was created, the date and time this data was updated, and the data and time this data was read. Accordingly, the frequency of access to the metadata (i.e., the frequency of write access and the frequency of read access) is extremely high. Thus, the SSD for tier T1 used for storing the metadata is required to have high endurance.

As one index indicating the endurance of an SSD, the number of drive writes per day (DWPD) is known. For example, DWPD=10 means that for an SSD having a total capacity of 1 TB, writing of 10 TB (=10×1 TB) of data per day can be executed every day for five years. The SSD for tier T1 may be required to have an endurance of DWPD=10.

The ratio of the capacity of tier T1 to the capacity of the entire hierarchical storage system is, for example, 1%. This is because the size of the metadata is extremely small as compared to the size of the contents of the file.

The SSD for tier T2 is a medium-capacity SSD. The medium-capacity SSD may be, for example, an MLC-SSD which stores two-bit information per memory cell. The SSD for tier T2 is used as a storage for data which is less frequently updated than the metadata. The SSD for tier T2 may be required to have an endurance of DWPD=1. The ratio of the capacity of tier T2 to the capacity of the entire hierarchical storage system is, for example, 4%.

The SSD for tier T3 is a low-cost, large-capacity SSD. The large-capacity SSD may be, for example, an MLC-SSD or a TLC-SSD. The SSD for tier T3 is used as storage for data which is rarely updated. It may be sufficient for the SSD for T3 to have low durability of DWPD=0.1 or so. The ratio of the capacity of tier T3 to the capacity of the entire hierarchical storage system is, for example, 95%.

The right side of FIG. 2 shows an example of a non-hierarchical storage system which stores all the data of three tiers T1 to T3 in a single SSD. The DWPD required for the entire non-hierarchical storage system can be obtained as follows:

$$DWPD=(10\times0.01)+(1\times0.04)+(0.1\times0.95)=0.235$$

Accordingly, if a non-hierarchical storage system is applied, while the capacity required for a single SSD is drastically increased, the endurance required for the SSD is reduced. In order to realize a low-cost, large-capacity SSD, it is suitable to employ an MLC-SSD or a TLC-SSD. While the write speed of the MLC-SSD/TLC-SSD is lower than that of the SLC-SSD, the read speed of the MLC-SSD/TLC-SSD is approximately the same as that of the SLC-SSD. Accordingly, even in a non-hierarchical storage system which uses only one SSD of low-cost and large-capacity, by adding the function of optimizing the endurance relationship between tiers within this SSD, it is possible to obtain endurance and performance that are substantially equivalent to those of a hierarchical storage system.

FIG. 3 shows an example of allocating physical resources among areas (namespaces) in the SSD 3 (SSD #1) of the present embodiment.

The storage space of SSD #1 is logically divided into areas 51, 52, 53, 54, and 55 for storing several kinds of data (hot data, warm data, tepid data, cool data, and cold data) having different frequencies of update, respectively, for example.

The data is classified into five data groups (hot data, warm data, tepid data, cool data, and cold data) according to the frequency of update. The frequency of updating the data is decreased in the order of hot data, warm data, tepid data, cool data, and cold data. The warm data, tepid data, and cool data are data having an intermediate level of frequency of update between the hot data and the cold data.

Area 51 is used as a tier storage (tier #1) for storing hot data. A namespace (NS #1) is associated with area 51. Area 51 is used for storing the hot data (active data) having a small capacity and a high update frequency. An example of the ratio of the capacity of area 51 to the total capacity of SSD #1 may be 1%. An example of the DWPD required for area 51 may be 10.

Area 52 is used as a tier storage (tier #2) for storing warm data. A namespace (NS #2) is associated with area 52. An example of the ratio of the capacity of area 52 to the total capacity of SSD #1 may be 2%. An example of the DWPD required for area 52 may be 3.

Area 53 is used as a tier storage (tier #3) for storing tepid data. A namespace (NS #3) is associated with area 53. An example of the ratio of the capacity of area 53 to the total capacity of SSD #1 may be 3%. An example of the DWPD required for area 53 may be 1.

Area 54 is used as a tier storage (tier #4) for storing cool data. A namespace (NS #4) is associated with area 54. An example of the ratio of the capacity of area 54 to the total capacity of SSD #1 may be 14%. An example of the DWPD required for area 54 may be 0.3.

Area 55 is used as a tier storage (tier # n) for storing cold data. A namespace (NS # n) is associated with area 55. Area 55 is used for storing the cold data (non-active data) having a large capacity and a low update frequency. An example of the ratio of the capacity of area 55 to the total capacity of SSD #1 may be 80%. For example, the frequency of updating area 55 is approximately $\frac{1}{100}^{th}$ the frequency of updating area 51. Accordingly, an example of the DWPD required for area 55 may be 0.1.

As described above, the hot data, warm data, tepid data, cool data, and cold data are stored in different areas, respectively. Thus, it is possible to prevent occurrence of a situation in which items of data having different frequencies of update, for example, the hot data and the cold data, are mixed in the same physical block. As a result, it is possible to reduce write amplification of the SSD 3.

When physical resources are allocated to areas 51 to 55 at the ratio shown in FIG. 3, the DWPD required for the SSD 3 (SSD #1) as a whole can be obtained as follows:

DWPD=(10×0.01)+(3×0.02)+(1×0.03)+(0.3×0.14)+
(0.1×0.8)=0.312

This means that in principle, the SSD 3 (SSD #1) logically divided into areas 51 to 55 can be realized by a large-capacity, low-cost SSD.

In the present embodiment, as described above, the host 2 can specify the number of physical blocks to be secured for each of the namespaces, and the SSD 3 can allocate a specified number of physical blocks to individual areas (tiers) separately.

If tiers are realized by different SSDs, unless the SSDs themselves being used are replaced, it is not possible to change the sizes of individual tiers. In the present embodiment, the same SSD is logically divided into a plurality of tiers (areas). Accordingly, the sizes of individual tiers can be optimized in accordance with the workload and the endurance which should be set for each tier (area).

That is, in the present embodiment, the number of physical blocks which should be allocated to areas 51 to 55 can be determined by the control of the host 2 for each of the areas.

For example, the host software can request the SSD 3 to allocate a sufficient number of physical blocks exceeding the expected total amount of hot data (the user data capacity) with respect to area 51 (tier #1) for hot data. In response to this request, the controller 4 of the SSD 3 allocates a specified number of physical blocks dedicated to area 51 (tier #1) for hot data to this area 51 (tier #1) for hot data. For example, when the expected total amount of hot data (the user data capacity) is 100 GB, the host software may request allocation of physical blocks equivalent in number to 200 GB. In this case, the controller 4 allocates that number of physical blocks equivalent to 200 GB to area 51 (tier #1). As a result, physical blocks equivalent in number to twice the capacity of a user area of area 51 (tier #1) are allocated for area 51 (tier #1). The physical resources of 100 GB, which is the remainder when the capacity of the user area is subtracted from 200 GB, serve as an over-provision area of area 51 (tier #1).

Here, the over-provision area will be described.

Over-provisioning means allocating a storage capacity within the SSD 3 which is not visible to the host 2 as an available user space (a user accessible LBA space). A space in which a storage capacity which is not visible to the host 2 as the user accessible LBA space is allocated is the over-provision area. By the over-provisioning, physical blocks having the capacity exceeding the user accessible LBA space (the user area capacity) are allocated.

In an ordinary SSD, while a host can specify the number of LBAs for a certain namespace, the number of physical blocks which should be allocated for this namespace cannot be specified. Also, normally, only one over-provision area is set within a single SSD.

In contrast, in the present embodiment, it is possible to allocate physical blocks whose respective numbers are specified by the host 2 to the namespaces (areas) individually, and moreover, to enable an over-provision area of a desired capacity to be set for each of the areas as a consequence.

For example, the total capacity of area 51 (the total capacity of NS #1) is determined by the total number of physical blocks allocated to area 51. Area 51 includes a user area 51*a* and an over-provision area 51*b*. The remainder when the capacity of the user area 51*a* is subtracted from the total capacity of area 51 serves as the over-provision area 51*b*. The user area 51*a* is a group of physical blocks allocated to the LBAs. By the presence of the over-provision area 51*b*, the endurance and performance of the user area 51*a* in area 51 is improved.

Similarly, in each of the other areas, the remainder when the capacity of the user area in the corresponding area is subtracted from the capacity determined by the total number of physical blocks allocated to this area serves as the over-provision area in this area.

Likewise area 51 for hot data, also for area 52 (tier #2) for warm data, the host software can request the SSD 3 to allocate physical blocks whose number exceeds the expected total amount of warm data (the user area capacity). In response to this request, the controller 4 of the SSD 3 allocates a specified number of physical blocks dedicated to area 52 for warm data to this area 52 (tier #2) for warm data. For example, when the expected total amount of warm data (the user data capacity) is 200 GB, and allocation of physical blocks equivalent in number to 250 GB is requested by the host software, the controller 4 allocates that number of physical blocks equivalent to 250 GB to area 52 (tier #2). As a result, physical resources that are greater than the capacity of the user area of area 52 (tier #2) by 50 GB are allocated to area 52 (tier #2). The physical resources of 50 GB, which is the remainder when the capacity of the user area is subtracted from the physical resources of 250 GB, serve as an over-provision area of area 52 (tier #2).

Similarly, the host software specifies the quantity of physical blocks to be allocated for each of the remaining areas.

For example, the host software can request the SSD 3 to allocate a minimum number of physical blocks determined in consideration of the expected total amount of cold data (the user data capacity) with respect to area 55 (tier # n) for cold data. In response to this request, the controller 4 allocates a specified number of physical blocks dedicated to area 55 (tier # n) for cold data to this area 55 (tier # n) for cold data. For example, when the expected total amount of cold data (the user data capacity) is 8000 GB, and allocation of physical blocks equivalent in number to 8001 GB is requested by the host software, the controller 4 allocates that number of physical blocks equivalent to 8001 GB to area 55 (tier # n). As a result, physical resources that are greater than the capacity of the user area of area 55 (tier # n) by 1 GB are allocated to area 55 (tier # n). The physical resources of 1 GB, which is the remainder when the user data capacity is subtracted from the physical resources of 8001 GB, serve as an over-provision area of area 55 (tier # n).

As described above, the SSD 3 allocates a specified number of physical blocks to each of the areas based on a request from the host 2 specifying the number of physical blocks to be secured for each of the namespaces. As a result, the ratio between the capacity of the over-provision area and the capacity of the user area can be optimized for each of the areas. For example, the number of physical blocks to be allocated to each area may be adjusted such that the higher the tier is, the more the over-provision area to be allocated is increased. In this case, the ratio of the capacity of the over-provision area in area 55 to the capacity of the user area in area 55 is less than the ratio of the capacity of the over-provision area in area 51 to the capacity of the user area in area 51.

In area 51, by the use of a large-size over-provision area, the write amplification of area 51 can be reduced efficiently. This is because even if physical blocks of the user area 51*a* of area 51 are filled with data of 100 MB, and as a consequence, none of these physical blocks includes an available page without erasing of the blocks, physical blocks of the over-provision area 51*b* can be used in a write of the data instead of the physical blocks of the user area 51*a*. Thereby, timing at which the garbage collection operation of area 51 is executed can be delayed adequately. As data is written to the physical blocks of the over-provision area 51*b*, the data in the physical blocks of the user area 51*a* is invalidated by the update. Physical blocks in which all of data are invalidated can be reused without performing the garbage collection of those physical blocks. Accordingly, since it is possible to efficiently reduce the write amplification of area 51, the program/erase cycles of the physical blocks of area 51 can be reduced. This means that the endurance of area 51 can be improved.

Since the over-provision area of area 55 is small, the write amplification of area 55 is increased. However, the frequency of updating area 55 for cold data is far less than that of updating area 51 for hot data. For example, the frequency of updating area 55 for cold data is approximately one out of a hundred of the frequency of updating area 51 for hot data. That is, while area 51 is rewritten one hundred times, area 55 is rewritten only once, and thus, the number of program/erase cycles of each of the physical blocks of area 55 for cold data is extremely small. Accordingly, with respect to area 55 for cold data, even if write amplification of that area is significant, a phenomenon in which the program/erase cycles of physical blocks of area 55 for cold data soon reach the upper limit of the program/erase cycles of the SSD 3 does not occur.

Figure 4:
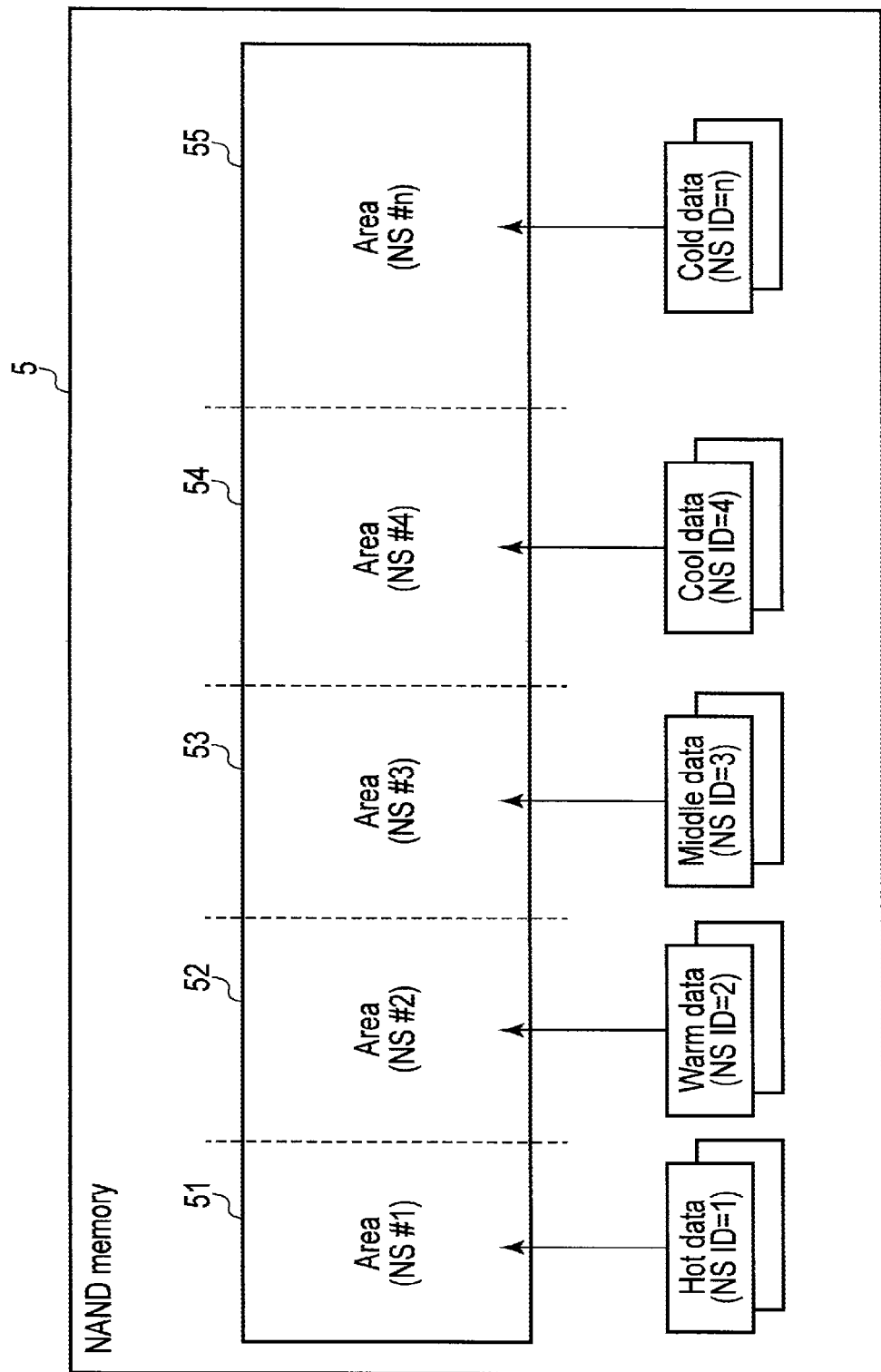
FIG. 4 is an illustration for describing the relationship between a plurality of areas in the memory system of the embodiment and data written to these areas.

FIG. 4 shows the relationship between areas 51 to 55 and the data to be written to areas 51 to 55.

The NAND memory 5 is logically divided into areas 51 to 55 corresponding to namespaces NS #1 to NS #5. Write data associated with an ID of namespace NS #1 (NSID=1), that is, the hot data, is written to area 51. Write data associated with an ID of namespace NS #2 (NSID=2), that is, the warm data, is written to area 52. Similarly, write data associated with an ID of namespace NS # n (NSID=n), that is, the cold data, is written to area 55.

FIG. 5 shows namespace management by the SSD 3.

Here, a case where a plurality of namespaces NS #1 to NS # n are created is assumed. Logical address space (LBA space) A1 of 0 to E0 is allocated to namespace NS #1. Logical address space (LBA space) A2 of 0 to E1 is allocated to namespace NS #2. Similarly, logical address space (LBA space) An of 0 to En is allocated to namespace NS # n.

In the present embodiment, a look-up table LUT is divided for each of the namespaces. That is, n look-up tables LUT #1 to LUT # n corresponding to namespaces NS #1 to NS # n are managed by the controller 4 of the SSD 3.

Look-up table LUT #1 manages mapping between LBAs of namespace NS #1 (i.e., LBA space A1) and physical addresses of the NAND memory 5. Look-up table LUT #2 manages mapping between LBAs of namespace NS #2 (i.e., LBA space A2) and physical addresses of the NAND memory 5. Look-up table LUT # n manages mapping between LBAs of namespace NS # n (i.e., LBA space An) and physical addresses of the NAND memory 5.

The controller 14 can perform the garbage collection operation independently for each of the namespaces (areas) by using look-up tables LUT #1 to LUT # n.

Management data 100 may hold information indicating the relationship between namespaces NS #1 to NS # n and the number of physical blocks allocated to each of these namespaces NS #1 to NS # n.

In the present embodiment, free blocks created by the garbage collection can be shared among namespaces NS #1 to NS # n.

FIG. 6 shows an extended namespace management command.

The extended namespace management command is used for namespace management including creation and deletion of a namespace. The extended namespace management command includes the following parameters:

(1) Creation/deletion
(2) LBA range
(3) Physical resource size
(4) Tier attribute (optional)

The value 0 h of the creation/deletion parameter requests creation of a namespace to the SSD 3. The value 1 h of the creation/deletion parameter requests deletion of a namespace to the SSD 3. When deletion of a namespace is requested, a parameter indicating the ID of the namespace to be deleted is set to the extended namespace management command.

The LBA range parameter indicates the LBA range (LBA 0 to n−1) of the namespace. This LBA range is mapped to a user area of the namespace.

The physical resource size parameter indicates the number of physical blocks to be secured for a namespace.

In another embodiment, instead of the physical resource size parameter, the extended namespace management command may include a parameter indicative of the size of over-provision.

The over-provision size parameter indicates the number of physical blocks to be secured for an over-provision area within the area associated with the namespace. If the extended namespace management command includes a parameter corresponding to the size of the over-provision, the SSD 3 may create a namespace and allocate physical blocks whose number is specified by this parameter to an over-provision area within the area associated with this namespace.

The tier attribute parameter indicates a tier attribute corresponding to this namespace. The relationship between the value of the tier attribute parameter and the tier attribute is as follows:

000: Hot
001: Warm
010: Tepid
011: Cool
100: Cold

Figure 7:
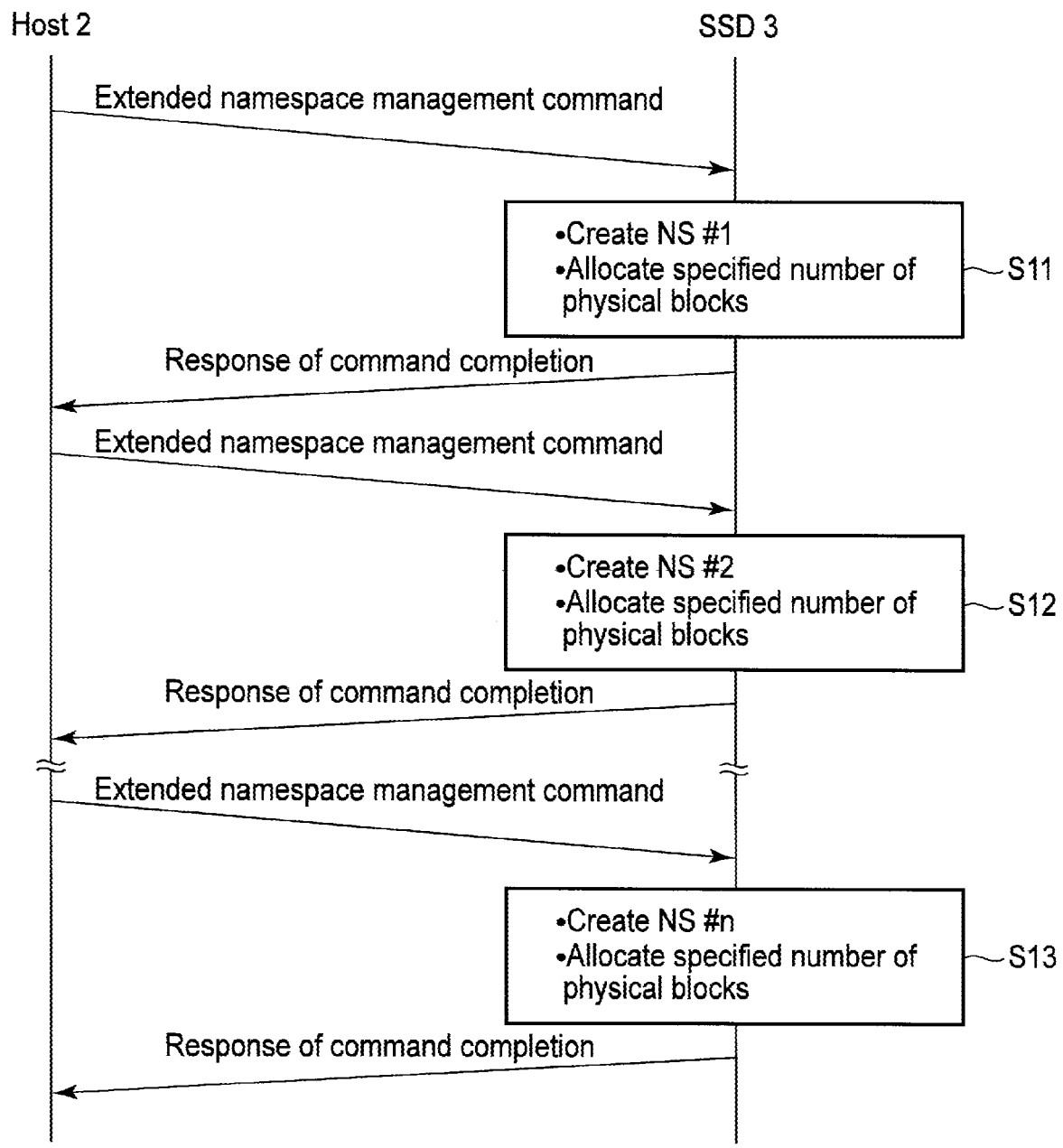
FIG. 7 is an illustration showing a sequence of physical resource allocation processes executed by the memory system of the embodiment.

FIG. 7 shows a sequence of physical resource allocation processes executed by the host 2 and the SSD 3.

The host 2 sends an extended namespace management command requesting creation of a namespace (an area for hot data) to the SSD 3. This extended namespace management command includes a physical resource size parameter specifying the number of physical blocks to be secured for the area for hot data. Since the capacity of one physical block within the SSD 3 is reported to the host 2 from the SSD 3, the host 2 can request the number of physical blocks suitable for the area for hot data. In response to receipt of the extended namespace management command, the controller 4 of the SSD 3 creates namespace NS #1 and allocates a specified number of physical blocks to this namespace NS #1 (step S11). The controller 4 sends a response indicating completion of the command to the host 2. This response may include the ID of the created namespace.

The host 2 sends an extended namespace management command requesting creation of the next namespace (an area for warm data) to the SSD 3. This extended namespace management command includes a physical resource size parameter specifying the number of physical blocks to be secured for the area for warm data. In response to receipt of the extended namespace management command, the controller 4 of the SSD 3 creates namespace NS #2 and allocates a specified number of physical blocks to this namespace NS #2 (step S12). The controller 4 sends a response indicating completion of the command to the host 2. This response may include the ID of the created namespace.

Similarly, the other namespaces (an area for tepid data and an area for cool data) are created.

Further, the host 2 sends an extended namespace management command requesting creation of a next namespace (an area for cold data) to the SSD 3. This extended namespace management command includes a physical resource size parameter specifying the number of physical blocks to be secured for the area for cold data. In response to receipt of the extended namespace management command, the controller 4 of the SSD 3 creates namespace NS # n and allocates a specified number of physical blocks to this namespace NS # n (step S13). The controller 4 sends a response indicating completion of the command to the host 2. This response may include the ID of the created namespace.

As described above, by repeating the process of creating a namespace while allocating a specified number of physical blocks to the namespace, the NAND memory 5 is logically divided into a plurality of areas, and a specified number of physical blocks are allocated to each of the areas.

The flowchart of FIG. 8 shows steps of a physical resource allocation process executed by the SSD 3.

The controller 4 of the SSD 3 receives an extended namespace management command from the host 2 (step S21). The controller 4 determines whether the extended namespace management command requests creation of a namespace based on the creation/deletion parameter in the extended namespace management command (step S22).

If the extended namespace management command requests creation of a namespace (YES in step S22), the controller 4 determines whether physical blocks whose number is specified by the physical resource parameter in the extended namespace management command can be secured, on the basis of the number of remaining physical blocks in the free blocks (step S23).

If the number of remaining physical blocks is greater than or equal to the specified number (YES in step S23), the controller 4 creates a namespace and allocates the specified number of physical blocks to an area associated with this namespace (step S24). The controller 4 notifies the host 2 of completion of the command (step S25).

If the number of remaining physical blocks is less than the specified number (NO in step S23), the controller 4 notifies the host 2 of an error (step S26). The host 2 which received a report of the error may change the number of physical blocks to be secured. Alternatively, the host 2 which received a response of the error may start over again on the process of creating each of the namespaces while specifying the number of physical blocks to be secured for each of the namespaces.

The flowchart of FIG. 9 shows steps of a write command sending process executed by the host 2.

When a request to write data is made (YES in step S31), the host 2 classifies this write data (data to be written) into one of hot data, warm data, tepid data, cool data, and cold data (step S32). The host 2 may classify the write data (the data to be written) into one of hot data, warm data, tepid data, cool data, and cold data according to the type of the data, such as whether it is metadata or the contents of the file.

If the write data is hot data (YES in step S33), the host 2 sends a write command including the ID of the namespace for hot data (NSID #1) to the SSD 3 (step S36).

If the write data is warm data (YES in step S34), the host 2 sends a write command including the ID of the namespace for warm data (NSID #2) to the SSD 3 (step S37).

If the write data is cold data (YES in step S35), the host 2 sends a write command including the ID of the namespace for cold data (NSID # n) to the SSD 3 (step S38).

FIG. 10 shows the write command.

The write command includes the following parameters:
(1) Starting LBA
(2) Number of logical blocks
(3) Namespace ID The starting LBA parameter indicates the LBA of the first logical block to be written.

The number of logical blocks parameter indicates the number of logical blocks corresponding to the data to be written (that is, the transfer length).

The namespace ID parameter indicates an ID of the namespace to which the data should be written.

FIG. 11 shows a process sequence of a write operation which is executed by the host 2 and the SSD 3.

The host 2 sends a write command to the SSD 3, and sends write data to the SSD 3. The controller 4 of the SSD 3 writes the write data to the write buffer (WB) 31 (step S41), and notifies the host 2 of a response of the command completion. After that, the controller 4 writes the write data to an available block within an area which is associated with the namespace specified by the namespace ID in the write command (step S42).

FIG. 12 shows the garbage collection operation and the copy destination free block allocation operation executed by the SSD 3.

As described above, the garbage collection operation is executed for each of the namespaces. In the garbage collection operation of namespace NS #1, the controller 4 of the SSD 3 selects physical blocks, which are the target of the garbage collection, from the physical blocks (active blocks) within area 51 associated with namespace NS #1. For example, the controller 4 may specify several top physical blocks having a relatively high ratio of invalid data by referring to look-up table LUT #1, and select these physical blocks as the physical blocks to be garbage-collected.

The controller 4 manages a free block pool (a free block list) 60 including free blocks shared among the namespaces. The controller 4 selects a free block with the least number of program/erase cycles from the free blocks. The controller 4 allocates the selected free block as a copy destination free block B1000 to namespace NS #1. The controller 4 copies all of the valid data to the copy destination free block B1000 from physical blocks (blocks B0 to B3 in this case), which are the target of garbage collection. Further, the controller 4 updates the look-up table LUT #1 and maps the valid data to the copy destination free block B1000. Physical blocks B0 to B3, which are the target of garbage collection, become free blocks which do not contain valid data. These free blocks are moved to the free block pool.

The garbage collection operation is executed similarly for the other namespaces (NS #2 to NS # n).

For example, in the garbage collection operation of namespace NS # n, the controller 4 selects physical blocks, which are the target of the garbage collection, from the physical blocks (active blocks) within area 55 associated with namespace NS # n. For example, the controller 4 may specify several top physical blocks having a relatively high ratio of invalid data by referring to look-up table LUT # n, and select these physical blocks as the physical blocks to be garbage-collected.

The controller 4 selects a free block with the least number of program/erase cycles from the free blocks. The controller 4 allocates the selected free block as a copy destination free block B1001 to namespace NS # n. The controller 4 copies all of the valid data to the copy destination free block B1001 from physical blocks (blocks B2000 to B2003 in this case), which are the target of garbage collection. Further, the controller 4 updates the look-up table LUT # n and maps the valid data to the copy destination free block B1001. Physical blocks B2000 to B2003, which are the target of garbage collection, become free blocks which do not contain valid data. These free blocks are moved to the free block pool.

As described above, since the update frequency of namespace NS # n is far less than that of namespace NS #1, the number of program/erase cycles of a free block created by the garbage collection of namespace NS # n is small. Therefore, in the garbage collection operation of the present embodiment, when garbage collection of namespace NS #1 is executed, a physical block used in namespace NS # n in the past is allocated for namespace NS #1 as a copy destination free block. Accordingly, a physical block having a small number of program/erase cycles which has been used in namespace NS # n can be reused in namespace NS #1 effectively. Consequently, the endurance of namespace NS #1 can be improved.

Further, in order to improve the endurance of namespace NS #1, the controller 4 can execute a wear leveling process of interchanging physical blocks between namespace NS #1 and namespace NS # n. For example, when any of the physical blocks used in namespace NS #1 had its number of program/erase cycles reached a threshold number (the threshold number being set to a number smaller than the upper limit of the program/erase cycles), the controller 4 may interchange this physical block with a physical block having the least number of program/erase cycles within namespace NS # n.

Figure 13:
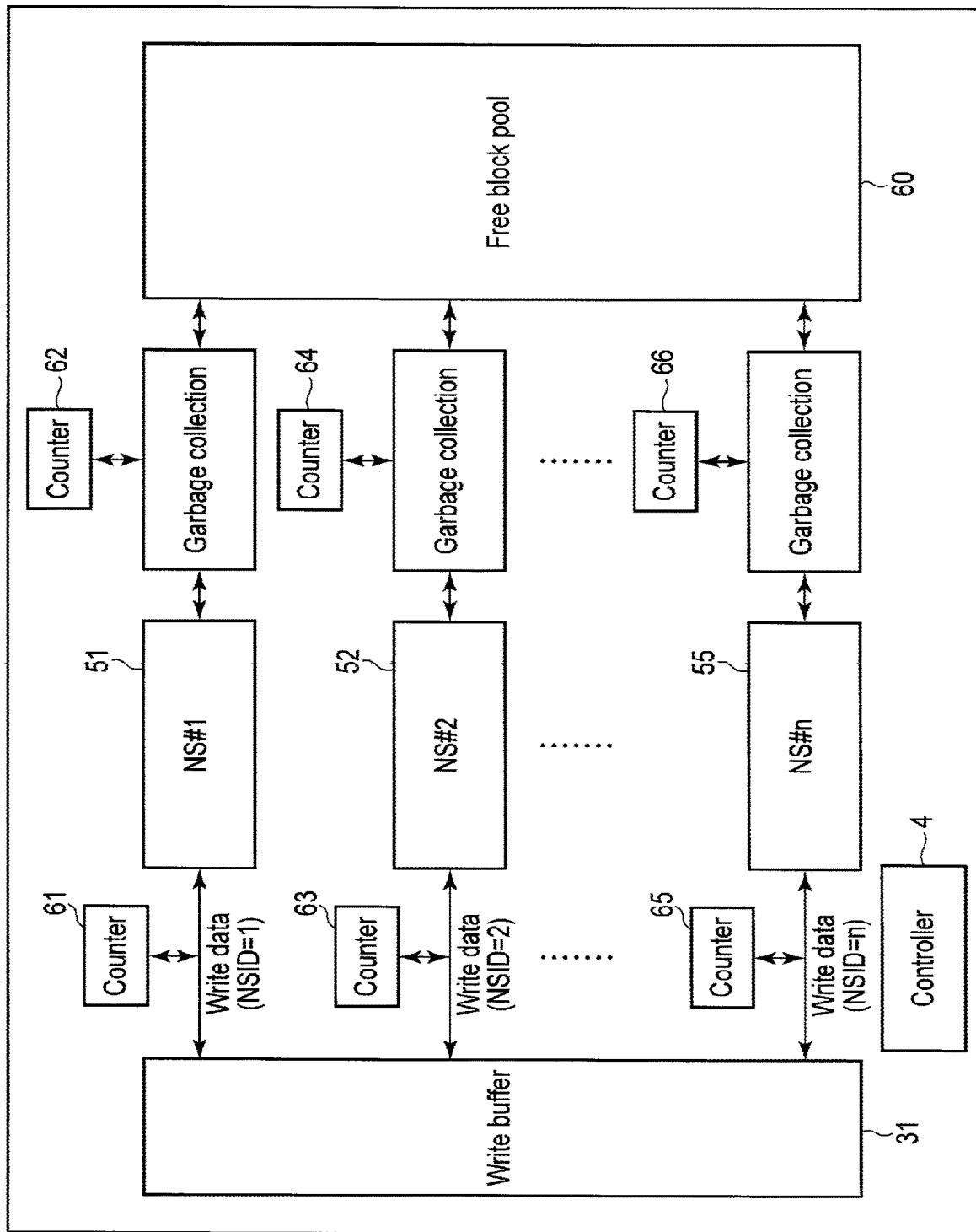
FIG. 13 is an illustration for describing a write data amount counting process executed by the memory system of the embodiment.

FIG. 13 shows a write data amount counting process executed by the SSD 3.

The controller 4 of the SSD 3 can calculate write amplification of each of the namespaces, not the write amplification of the entire SSD 3. Accordingly, the controller 4 comprises two types of counters, which are a counter for counting the amount of data written by the host 2, and a counter for counting the amount of data written by the garbage collection operation, for each of the namespaces.

Counters 61 and 62 are used for calculating the write amplification of namespace NS #1. Counter 61 counts the amount of data written to namespace NS #1, that is, area 51, by the host 2. Counter 62 counts the amount of data written to namespace NS #1, that is, area 51, by the garbage collection of namespace NS #1.

Counters 63 and 64 are used for calculating the write amplification of namespace NS #2. Counter 63 counts the amount of data written to namespace NS #2, that is, area 52, by the host 2. Counter 64 counts the amount of data written to namespace NS #2, that is, area 52, by the garbage collection of namespace NS #2.

Counters 65 and 66 are used for calculating the write amplification of namespace NS # n. Counter 65 counts the amount of data written to namespace NS # n, that is, area 55, by the host 2. Counter 66 counts the amount of data written to namespace NS # n, that is, area 55, by the garbage collection of namespace NS # n.

Figure 14:
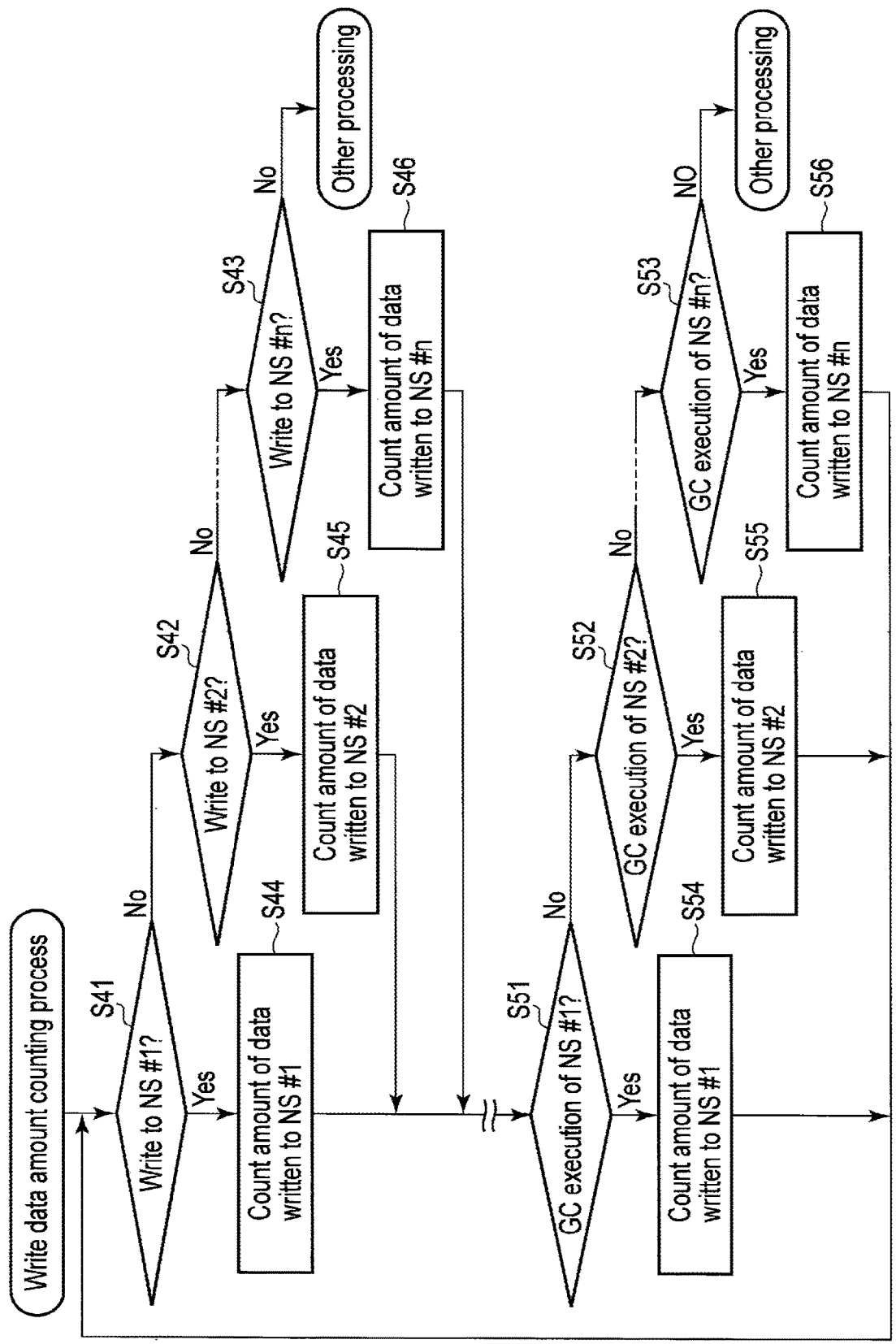
FIG. 14 is a flowchart showing steps of the write data amount counting process executed by the memory system of the embodiment.

The flowchart of FIG. 14 shows steps of the write data amount counting process executed by the SSD 3.

When the controller 4 of the SSD 3 has received a write command from the host 2, the controller 4 determines the target namespace (area) to which the write data should be written, on the basis of the namespace ID included in the write command (steps S41 to S43). Further, the controller 4 writes the write data to the target namespace (area), and also counts the amount of data to be written (steps S44 to S46).

For example, when the target namespace (area) is namespace NS #1 (YES in step S41), the controller 4 uses counter 61 and counts the amount of data written to namespace NS #1 (step S44). In step S44, a count value at present of counter 61 may be incremented by the transfer length of the write data.

If the target namespace (area) is namespace NS #2 (YES in step S42), the controller 4 uses counter 63 and counts the amount of data written to namespace NS #2 (step S45). In step S45, a count value at present of counter 63 may be incremented by the transfer length of the write data.

If the target namespace (area) is namespace NS # n (YES in step S43), the controller 4 uses counter 65 and counts the amount of data written to namespace NS # n (step S46). In step S46, a count value at present of counter 65 may be incremented by the transfer length of the write data.

When a garbage collection operation of namespace NS #1 is executed (YES in step S51), the controller 4 uses counter 62 and counts the amount of data written to namespace NS #1 by this garbage collection operation (step S54). In step S54, a count value of counter 62 may be incremented by the total amount of whole valid data in the physical blocks, which are the target of the garbage collection operation.

When a garbage collection operation of namespace NS #2 is executed (YES in step S52), the controller 4 uses counter 64 and counts the amount of data written to namespace NS #2 by this garbage collection operation (step S55). In step S55, a count value of counter 64 may be incremented by the total amount of whole valid data in the blocks, which are the target of the garbage collection operation.

When a garbage collection operation of namespace NS # n is executed (YES in step S53), the controller 4 uses counter 66 and counts the amount of data written to namespace NS # n by this garbage collection operation (step S56). In step S56, a count value of counter 66 may be incremented by the total amount of whole valid data in the blocks, which are the target of the garbage collection operation.

The flowchart of FIG. 15 shows steps of a write amplification (WA) calculation process executed by the SSD 3.

The controller 4 of the SSD 3 acquires the amount of data written to namespace NS #1 by the host 2 (i.e., the count value of counter 61) (step S61). The controller 4 acquires the amount of data written to namespace NS #1 by the garbage collection operation of namespace NS #1 (i.e., the count value of counter 62) (step S62). The controller 4 calculates write amplification of namespace NS #1 based on the count value of counter 61 and the count value of counter 62 (step S63). Write amplification (NS #1-WA) of namespace NS #1 can be obtained as follows:

NS #1-WA=(count value of counter 61+count value of counter 62)/(count value of counter 61)

The controller 4 acquires the amount of data written to namespace NS #2 by the host 2 (i.e., the count value of counter 63) (step S64), The controller 4 acquires the amount of data written to namespace NS #2 by the garbage collection operation of namespace NS #2 (i.e., the count value of counter 64) (step S65). The controller 4 calculates write amplification of namespace NS #2 based on the count value of counter 63 and the count value of counter 64 (step S66). Write amplification (NS #2-WA) of namespace NS #2 can be obtained as follows:

NS #2-WA=(count value of counter 63+count value of counter 64)/(count value of counter 63)

The controller 4 acquires the amount of data written to namespace NS # n by the host 2 (i.e., the count value of counter 65) (step S67). The controller 4 acquires the amount of data written to namespace NS # n by the garbage collection operation of namespace NS # n (i.e., the count value of counter 66) (step S68). The controller 4 calculates write amplification of namespace NS # n based on the count value of counter 65 and the count value of counter 66 (step S69). Write amplification (NS # n-WA) of namespace NS # n can be obtained as follows:

NS #n-WA=(count value of counter 65+count value of counter 66)/(count value of counter 65)

When a WA GET command requesting that the write amplification of each of the namespaces be reported is received from the host 2 (YES in step S70), the controller 4 sends the return data shown in FIG. 16 to the host 2 and notifies the host 2 of the write amplification of each of the namespaces (step S71).

The process of steps S61 to S69 may be executed in response to receipt of the WA GET command.

The flowchart of FIG. 17 shows steps of a counter reset process executed by the SSD 3.

The counter reset process is used to provide, to the host 2, write amplification of each namespace of the SSD 3 after a specific reset event such as a change in the setting of the SSD 3 has occurred. A change in the setting of the SSD 3 may be, for example, a change in the setting of a certain namespace or deletion of a certain namespace. Alternatively, an example of the change in the setting of the SSD 3 may be a change in the setting of the entire SSD 3.

The SSD 3 executes the counter reset process in accordance with a request from the host 2.

The request may be a command requesting that the counter be reset. In response to receipt of this command, the SSD 3 may reset counters 61 to 66 corresponding to all of the namespaces. When the command includes a namespace ID, the SSD 3 may reset only the two counters which are associated with the namespace corresponding to the namespace ID.

Alternatively, a control command for changing the setting of a certain namespace or setting of the entire SSD 3 may be handled as this request. A change in the setting of a certain namespace may be a change in the size (LBA range) of the namespace or a change in the number of physical blocks for the namespace.

Although the embodiment is not limited to the following, the steps of the counter reset process will be exemplified by describing a case where the counter reset process is executed in response to a change in the setting of a certain namespace.

When the controller 4 receives a control command requesting that the setting of a namespace be changed from the host 2, the controller 4 determines the namespace whose setting is to be changed (i.e., the target namespace) on the basis of the namespace ID in the control command.

If the target namespace is namespace NS #1 (YES in step S81), the controller 4 changes the setting of namespace NS #1 in accordance with the parameter in the control command (step S82). The controller 4 clears the count values of counters 61 and 62 corresponding to namespace NS #1 to zero (step S83).

If the target namespace is namespace NS #2 (YES in step S84), the controller 4 changes the setting of namespace NS #2 in accordance with the parameter in the control command (step S85). The controller 4 clears the count values of counters 63 and 64 corresponding to namespace NS #2 to zero (step S86).

If the target namespace is namespace NS # n (YES in step S87), the controller 4 changes the setting of namespace NS # n in accordance with the parameter in the control command (step S88). The controller 4 clears the count values of counters 65 and 66 corresponding to namespace NS # n to zero (step S89).

FIG. 18 shows an extended garbage collection (GC) control command.

As described above, the extended garbage collection (GC) control command is used as a host-initiated garbage collection command for controlling the garbage collection operation of an arbitrary namespace of the SSD 3 by the host 2.

The extended garbage collection (GC) control command includes the following parameters:

(1) Namespace ID
(2) Amount of free blocks
(3) Timer

The namespace ID parameter indicates an ID of a target namespace for which the garbage collection should be executed.

The amount of free blocks parameter indicates the amount of free blocks (for example, the number of free blocks) which should be secured for the target namespace.

The timer parameter specifies the maximum time of garbage collection operation.

The host 2 requests the SSD 3 to execute garbage collection of an arbitrary namespace in namespace NS #1 to namespace NS # n by using the extended garbage collection (GC) control command.

For example, the host 2 may monitor the write amplification of individual namespaces (areas) by transmitting a WA GET command to the SSD 3 on a regular basis. When the write amplification of a certain namespace (area) has reached a write amplification threshold corresponding to this namespace, the host 2 may send an extended garbage collection (GC) control command including a namespace ID of this namespace to the SSD 3.

Alternatively, if the host 2 desires data to be written to a certain namespace (area) with favorable latency, the host 2 may send an extended garbage collection (GC) control command including a namespace ID of this namespace to the SSD 3.

In response to receipt of the extended garbage collection (GC) control command from the host 2, the controller 4 of the SSD 3 executes the garbage collection operation for securing a specified amount of free space, which is dedicated to the target namespace. The controller 4 finishes the garbage collection operation at the earlier of when a specified amount of free space has been secured or when the maximum time has elapsed.

The flowchart of FIG. 19 shows steps of the garbage collection operation executed by the SSD 3.

When the controller 4 of the SSD 3 received an extended garbage collection (GC) control command from the host 2 (YES in step S91), the controller 4 executes the garbage collection operation of a target namespace specified by the namespace ID in the extended garbage collection (GC) control command (step S92). In step S92, the controller 4 selects several physical blocks, which are the target of the garbage collection, from active blocks of the target namespace, and copies valid data in these selected physical blocks to a copy destination physical block.

The garbage collection operation is finished at the earlier of when a specified amount of free space has been secured or when the maximum time has elapsed (steps S93 and S94).

FIG. 20 shows a process of controlling the ratio between a code for reducing the wear of a memory cell and an error correction code (ECC) in accordance with the namespace (area) to which the data should be written.

In the present embodiment, by controlling the ratio between a code for reducing the wear of a memory cell and an error correction code (ECC), a tradeoff between reliability (data retention) and endurance (DWPD value) can be optimized.

Here, an outline of an operation for encoding the write data by using a code (coding) for reducing the wear of a memory cell per write will be described.

First, the controller 4 of the SSD 3 encodes the write data by using a code (coding) for reducing the wear on a memory cell to generate first encoded data (a portion indicated as "endurance code" in FIG. 20). This code (coding) is used to lower the frequency of occurrence of a specific code (a code of a high program level corresponding to a high-threshold voltage) which significantly wears the memory cell. An example of the code (coding) is the aforementioned endurance code (endurance coding).

For example, in MLC, a memory cell is set to a state (a program level) corresponding to one of four levels (E-level, A-level, B-level, and C-level) corresponding to two bits. E-level is an erased state. A threshold voltage distribution of the memory cell is raised in the order of E, A, B, and C. C-level state is a state (a program level) which significantly wears the memory cell.

In the encoding which uses a code (coding) for reducing the wear of a memory cell, a code corresponding to a specific level (for example, C-level) which significantly wears the memory cell, for example, may be converted into another code (for example, a long bit pattern corresponding to B-B, which is two B-levels in succession).

As can be seen, in the encoding, since a specific code (a bit pattern) which wears the memory cell is replaced by another long code (another bit pattern), a codeword of the write data is extended. Accordingly, in the encoding, the controller 4 may perform lossless compression of the write data first. Further, the controller 4 may replace each of the specific bit patterns in the compressed write data by another long bit pattern whereby the memory cell wears less.

The controller 4 adds an error correction code (ECC) to the first encoded data ("endurance code" in FIG. 20) obtained by the encoding, thereby creating second encoded data (data including an endurance code and an ECC in FIG. 20), and writing this second encoded data to an available page in a physical block. Each page includes a data area and a redundancy area. The bit length of the second encoded data matches with the size of a page including the data area and the redundancy area.

Further, the controller 4 automatically changes the ratio between the first encoded data and the error correction code (ECC) in accordance with the area (namespace) to which the write data should be written.

The longer the first encoded data (the endurance code) is, the lower the frequency of occurrence of a specific code which significantly wears the memory cell becomes. Therefore, the longer the first encoded data (the endurance code) is, the more the wear of the memory cell per write can be reduced.

For example, when the write data is one which should be written to an area for hot data, the controller 4 controls the ratio between the first encoded data and the error correction code so that second encoded data including a combination of longer first encoded data and shorter error correction code can be obtained, in order to increase the endurance (DWPD) of the area for hot data. That is, in writing the hot data, an encoding method which prioritizes endurance over reliability (data retention) is used.

Meanwhile, when the write data is one which should be written to an area for cold data, the controller 4 controls the ratio between the first encoded data and the error correction code so that second encoded data including a combination of shorter first encoded data and longer error correction code can be obtained, in order to extend the data retention of data written to the area for cold data. That is, in writing the cold data, an encoding method which prioritizes reliability (data retention) over endurance is used.

In the present embodiment, as shown in FIG. 20, the higher the rewrite frequency (the frequency of update) of the namespace (area) is, the shorter the bit length of the ECC becomes, and instead, the longer the bit length of the first encoded data (endurance code) becomes. Also, the lower the rewrite frequency (the frequency of update) of the namespace (area) is, the longer the bit length of the ECC becomes, and instead, the shorter the bit length of the first encoded data (endurance code) becomes.

Since the number of correctable bits is increased as the bit length of the ECC is increased, the reliability (data retention) is improved. Normally, as time passes, a bit error rate is increased.

Accordingly, an increase in the number of correctable bits can improve the data retention.

On the other hand, as described above, since the wear of memory cells within a page can be reduced as the bit length of the endurance code is increased, the endurance can be improved.

Figure 21:
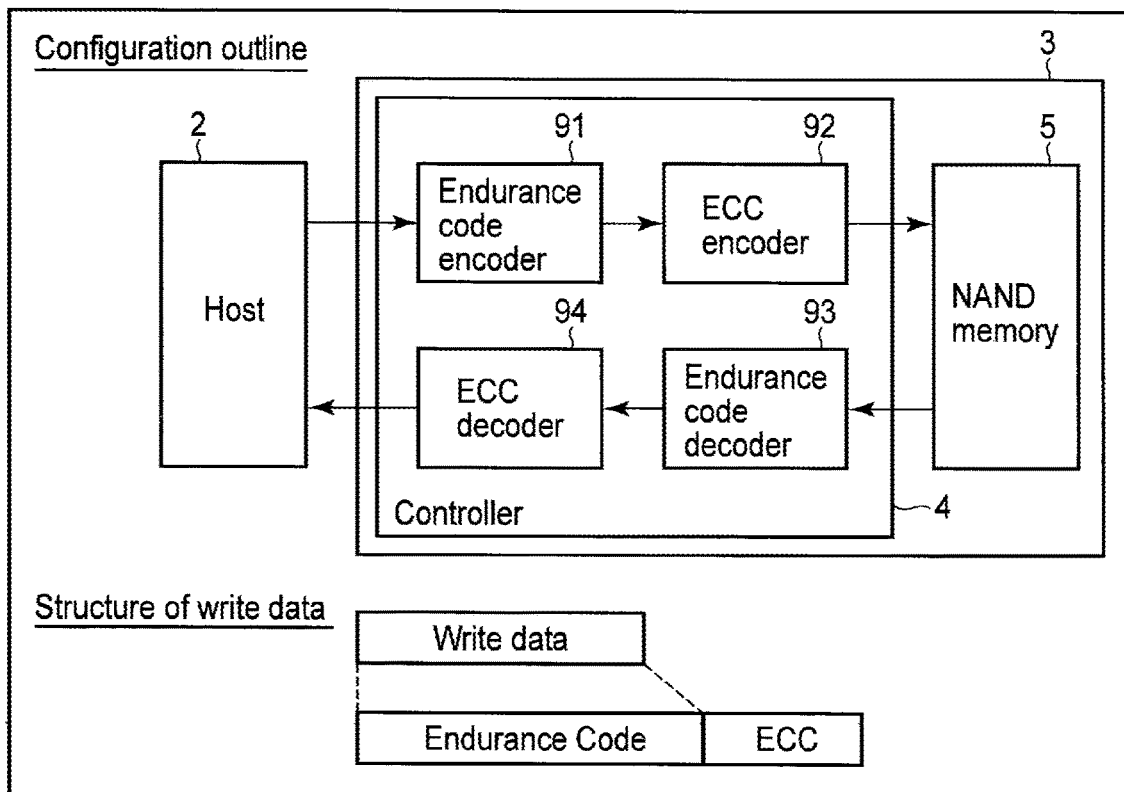
FIG. 21 is an illustration for describing an encoding process and a decoding process executed by the memory system of the embodiment.

FIG. 21 shows an encoding process and a decoding process executed by the SSD 3.

The controller 4 of the SSD 3 includes an endurance code encoder 91, an ECC encoder 92, an endurance code decoder 93, and an ECC decoder 94.

The ECC encoder 92 and the ECC decoder 94 execute an ECC encoding process which generates an ECG and an ECC decoding process for error correction, respectively. In the ECC encoder 92, a systematic code for generating the ECC is used. Examples of the systematic code are a Hamming code, BHC code, Reed-Solomon code, etc.

The endurance code encoder 91 and the endurance code decoder 93 execute the encoding process for reducing the wear of a memory cell and the decoding process corresponding to the encoding process. In the endurance code encoder 91, in order to generate the first encoded data, an endurance code, which is a non-systematic code, is used. In the endurance code encoder 91, as described above, a specific code which significantly wears the memory cell (a bit pattern corresponding to C-level, for example) is converted into another long code (for example, a long bit pattern corresponding to B-B). That is, this encoding process is an extension process of extending the codeword.

Figure 22:
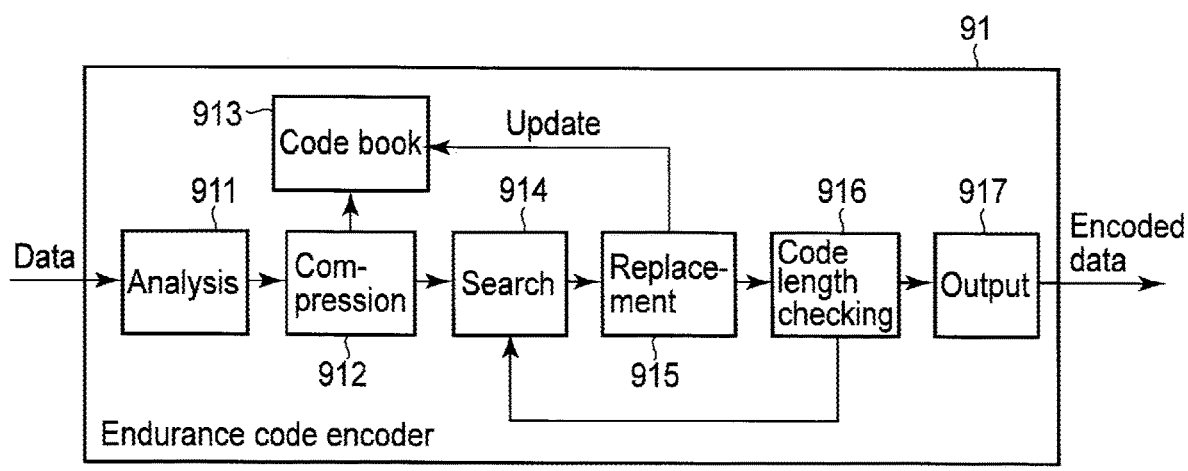
FIG. 22 is a block diagram showing a configuration example of an endurance code encoder within the memory system of the embodiment.

FIG. 22 is a configuration example of the endurance code encoder 91.

The endurance code encoder 91 includes an entropy analysis circuit 911, a compression circuit 912, a search circuit 914, a replacement circuit 915, a code length checking circuit 916, an output circuit 917, etc.

The entropy analysis circuit 911 obtains the number of occurrences (or a probability of occurrence) of each of the bit patterns which occur in the write data. The compression circuit 912 creates a code book 913 based on a result of analysis of the entropy analysis circuit 911, and performs lossless compression of the write data by using the code book 913. The code book 913 shows the relationship between each of the bit patterns which occur in the write data and a conversion code corresponding to each of these bit patters. The compression circuit 912 allocates a short conversion code to a bit pattern which occurs many times.

The search circuit 914 searches compressed data (compressed write data) starting from, for example, the most significant bit, in pursuit of a specific code which significantly wears the memory cell. The specific code may be a bit pattern corresponding to C-level, for example. The replacement circuit 915 replaces the specific code searched by the search circuit 914 with another long code (for example, a long bit pattern corresponding to B-B). In this way, a specific code in the compressed data is converted into another long code whereby the memory cell wears less. The replacement circuit 915 updates the code book 913, thereby replacing a specific conversion code in the code book 913 corresponding to the above specific code with another long code as mentioned above.

The code length checking circuit 916 checks the code length (the bit length) of the current compressed data. If the code length (the bit length) of the current compressed data is less than a predetermined threshold (a target bit length), a process of searching and replacing is repeated. In this way, the code length of the current compressed data is optimized.

The target bit length is changed adaptively in accordance with the namespace (area) to which the write data should be written. Accordingly, the higher the rewrite frequency (the frequency of update) of the namespace (area) is, the longer the bit length of the encoded data (endurance code) becomes. In other words, the lower the rewrite frequency (the frequency of update) of the namespace (area) is, the shorter the bit length of the encoded data (endurance code) becomes.

The output circuit 917 outputs compressed data having an optimized bit length as the first encoded data (endurance code). The code book 913 may be added to the first encoded data.

The flowchart of FIG. 23 shows steps of an encoding process for reducing the wear of a memory cell.

The controller 4 obtains the number of occurrences of several bit patterns in the write data, and sorts these bit patterns in descending order of the number of occurrences of the bit patterns (step S1). The controller 4 creates the code book 913 including conversion codes for compressing respective bit patterns based on a result of entropy analysis, and performs lossless compression of the write data by using the code book 913 (step S2).

The controller 4 generates the encoded data by encoding this compressed data with a code for reducing the wear of a memory cell.

In this case, the controller 4 searches for a certain code (a specific bit pattern) which wears the memory cell from the compressed data (step S3). The controller 4 converts the searched code (bit pattern) into another long code (bit pattern) whereby the memory cell wears less (step S4). The controller 4 updates the conversion code in the code book corresponding to this specific code which has been searched (step S5).

The controller 4 determines whether the bit length of the current compressed data (encoded data) is greater than the target bit length (step S6). The target bit length is determined in advance in accordance with the namespace (area) to which the data should be written. For example, a long target bit length is used for data (hot data) which should be written to namespace NS #1, and a short target bit length is used for data (cold data) which should be written to namespace NS # n.

If the bit length of the current compressed data (encoded data) is less than the target bit length, the process of steps S3 to S5 is executed again. The more the process of steps S3 to S5 is repeated, the more the frequency of occurrence of a specific code (a bit pattern corresponding to C-level, for example) which significantly wears the memory cell can be lowered. The bit length of the encoded data is increased accordingly.

If the bit length of the current compressed data (encoded data) has become greater than the target bit length (YES in step S6), the controller 4 adds the code book at the end, for example, of the encoded data (step S7).

The flowchart of FIG. 24 shows steps of a write control process executed by the SSD 3.

The controller 4 of the SSD 3 determines the attribute of the received write data, more specifically, the tier attribute of the namespace (area) to which this write data should be written. Further, in accordance with a result of this determination, an encoding method for encoding the write data is changed. A change in the encoding method is executed by controlling the ratio between the endurance code and the ECC.

That is, when the controller 4 of the SSD 3 receives a write command from the host 2 (YES in step S101), the controller 4 determines the tier attribute (hot/warm/tepid/cool/cold) of a target namespace (area) specified by the namespace ID in the write command (step S102). The tier attribute of the target namespace (area) may be determined on the basis of the size of the over-provision area of the target namespace (area) (the ratio between the user area and the over-provision area, etc.). Alternatively, if the extended namespace management command which requests creation of a target namespace includes the tier attribute parameter, the controller 4 may determine the tier attribute indicated by this tier attribute parameter as being a tier attribute of the target namespace. Alternatively, the write command may include a parameter indicative of the tier attribute of the target namespace in addition to the ID of the target namespace.

For example, if the tier attribute of the target namespace is hot (YES in step S103), that is, the write data is associated with an ID of namespace NS #1, the controller 4 encodes the write data by using an encoding method which prioritizes endurance over reliability by controlling the ratio between the endurance code and the ECC (step S104). With the encoding method described above, the write data is encoded to data including a combination of a longer endurance code and a shorter ECC. The controller 4 writes the encoded data to an available page of the physical block in area 51 (step S105).

For example, if the tier attribute of the target namespace is cold (YES in step S106), that is, the write data is associated with an ID of namespace NS # n, the controller 4 encodes the write data by using an encoding method which prioritizes reliability over endurance by controlling the ratio between the endurance code and the EGG (step S107). With the encoding method described above, the write data is encoded to data including a combination of a shorter endurance code and a longer EGG. The controller 4 writes the encoded data to an available page of the physical block in area 55 (step S108).

FIG. 25 shows the structure of a flash array storage of the present embodiment.

The flash array storage is recognized as a single storage device by the host 2. The flash array storage includes a plurality of SSDs, that is, SSD #1, SSD #2, SSD #3, . . . , SSD # n, which are controlled by striping for distributing data across the SSDs, in order to realize the large-capacity and high-speed feature.

Each of SSD #1, SSD #2, SSD #3, . . . , SSD # n includes a nonvolatile memory. Further, each of SSD #1, SSD #2, SSD #3, . . . , SSD # n has the namespace management function as in the SSD 3 of the present embodiment.

In this flash array, area 51 (NS #1) is arranged to extend over SSD #1, SSD #2, SSD #3, . . . , SSD # n. That is, area 51 is striped across SSD #1, SSD #2, SSD #3, . . . , SSD # n, and includes several physical blocks secured for namespace NS #1 of SSD #1, several physical blocks secured for namespace NS #1 of SSD #2, several physical blocks secured for namespace NS #1 of SSD #3, and several physical blocks secured for namespace NS #1 of SSD # n.

Area 52 (NS #2) is also arranged to extend over SSD #1, SSD #2, SSD #3, . . . , SSD # n. That is, area 52 is striped across SSD #1, SSD #2, SSD #3, . . . , SSD # n, and includes several physical blocks secured for namespace NS #2 of SSD #1, several physical blocks secured for namespace NS #2 of SSD #2, several physical blocks secured for namespace NS #2 of SSD #3, and several physical blocks secured for namespace NS #2 of SSD # n.

Area 53 (NS #3) is also arranged to extend over SSD #1, SSD #2, SSD #3, . . . , SSD # n. That is, area 53 is striped across SSD #1, SSD #2, SSD #3, . . . , SSD # n, and includes several physical blocks secured for namespace NS #3 of SSD #1, several physical blocks secured for namespace NS #3 of SSD #2, several physical blocks secured for namespace NS #3 of SSD #3, and several physical blocks secured for namespace NS #3 of SSD # n.

Area 54 (NS #4) is also arranged to extend over SSD #1, SSD #2, SSD #3, . . . , SSD # n. That is, area 54 is striped across SSD #1, SSD #2, SSD #3, . . . . SSD # n, and includes several physical blocks secured for namespace NS #4 of SSD #1, several physical blocks secured for namespace NS #4 of SSD #2, several physical blocks secured for namespace NS #4 of SSD #3, and several physical blocks secured for namespace NS #4 of SSD # n.

Area 55 (NS # n) is also arranged to extend over SSD #1, SSD #2, SSD #3, . . . , SSD # n. That is, area 55 is striped across SSD #1, SSD #2, SSD #3, . . . , SSD # n, and includes several physical blocks secured for namespace NS # n of SSD #1, several physical blocks secured for namespace NS # n of SSD #2, several physical blocks secured for namespace NS # n of SSD #3, and several physical blocks secured for namespace NS # n of SSD # n.

FIG. 26 shows a hardware configuration of the flash array storage illustrated in FIG. 25.

A flash array storage 80 includes a flash array controller 81, in addition to the above-mentioned SSD #1, SSD #2, SSD #3, . . . , SSD # n. The flash array controller 81 is configured to execute a striping operation for distributing (spreading) data across SSD #1, SSD #2, SSD #3, . . . , SSD # n. For example, in writing data to area 51 (NS #1), for example, the first 4 KB of data D1 is written to an area within SSD #1 corresponding to NS #1, the next 4 KB of data D2 is written to an area within SSD #2 corresponding to NS #1, the next 4 KB of data D3 is written to an area within SSD #3 corresponding to NS #1, the next 4 KB of data Dn is written to an area within SSD # n corresponding to NS #1, and the next 4 KB of data Dn+1 is written to an area within SSD #1 corresponding to NS #1.

In this way, the write data is dispersed into SSD #1, SSD #2, SSD #3, . . . , SSD # n in a predetermined data size (by the size of 4 KB). For example, when writing 1 MB of data to NS #1 is requested by the host 2, the data of 1 MB may be divided into data portions each having a predetermined data size (of 4 KB), and these data portions may be written in parallel with SSD #1, SSD #2, SSD #3, . . . , SSD # n.

As described above, since SSD #1, SSD #2, SSD #3, . . . , SSD # n are operated in parallel, the performance for data write can be enhanced.

The flash array controller 81 may be provided within the host 2, instead of the flash array storage 80, as shown in FIG. 27.

FIG. 28 shows the relationship between the capacity of each of the SSDs in the flash array storage 80 and the ratio of capacity allocated to a certain tier by these SSDs.

Here, tier #1 (NS #1) will be given as an instance. The host 2 sends an extended namespace management command to the flash array controller 81, and requests that physical blocks equivalent in number to 1% of the total capacity of the flash array storage 80 be secured for tier #1 (NS #1). The flash array controller 81 determines the number of physical blocks which should be secured for tier #1 (NS #1) in each of the SSDs based on the capacities of SSD #1, SSD #2, SSD #3, . . . , SSD # n.

Here, it is assumed that the capacity of SSD #1 is 100 GB, the capacity of SSD #2 is 200 GB, the capacity of SSD #3 is 1 TB, and the capacity of SSD # n is 100 GB.

The flash array controller 81 sends an extended namespace management command to SSD #1, and requests SSD #1 to secure physical blocks equivalent in number to 1% of the 100-GB capacity (i.e., 1 GB) for NS #1. The flash array controller 81 sends an extended namespace management command to SSD #2, and requests SSD #2 to secure physical blocks equivalent in number to 1% of the 200-GB capacity (i.e., 2 GB) for NS #1. The flash array controller 81 sends an extended namespace management command to SSD #3, and requests SSD #3 to secure physical blocks equivalent in number to 1% of the 1-TB capacity (i.e., 10 GB) for NS #1. The flash array controller 81 sends an extended namespace management command to SSD # n, and requests SSD # n to secure physical blocks equivalent in number to 1% of the 100-GB capacity (i.e., 1 GB) for NS #1.

FIG. 29 shows an example of a write operation corresponding to the capacity allocation of FIG. 28.

By the striping control, when data is to be written to area 51 (NS #1), for example, the first 4 KB of data D1 is written to an area within SSD #1 corresponding to NS #1. The next 4 KB of data D2 and the next 4 KB of data D3 are written to an area within SSD #2 corresponding to NS #1. The next data D3 to D13 are written to an area within SSD #3 corresponding to NS #1. The next 4 KB of data D14 is written to an area within SSD # n corresponding to NS #1, and the next 4 KB of data D15 is written to an area within SSD #1 corresponding to NS #1.

FIG. 30 shows a hardware configuration example of an information processing apparatus which functions as the host 2.

This information processing apparatus is realized as a server computer or a personal computer. The information processing apparatus includes a processor (CPU) 101, a main memory 102, a BIOS-ROM 103, a network controller 105, a peripheral interface controller 106, a controller 107, an embedded controller (EC) 108, etc.

The processor 101 is a CPU configured to control the operation of each of the components of the information processing apparatus. The processor 101 executes various programs loaded into the main memory 102 from any one of SSDs 3. The main memory 102 is constituted of a random-access memory such as a DRAM. Programs which are executed by the processor 101 include the application software layer 41, the OS 42, and the file system 43 described above. The file system 43 serves as the tier management module 44 described above.

Further, the processor 101 also executes a basic input output system (BIOS) stored in the BIOS-ROM 103, which is a nonvolatile memory. The BIOS is a system program for controlling hardware.

The network controller 105 is a communication device such as a wired LAN controller and a wireless LAN controller. The peripheral interface controller 106 is configured to execute communication with a peripheral device such as a USB device.

The controller 107 is configured to execute communication with devices connected to connectors 107A, respectively. In the present embodiment, the SSDs 3 may be connected to the connectors 107A, respectively. The controller 107 is, for example, a SAS expander, a PCIe switch, a PCIe expander, a flash array controller, or a RAID controller.

The EC 108 functions as a system controller configured to execute power management of the information processing apparatus. The EC 108 powers the information processing apparatus on and off in accordance with an operation of a power switch by the user. The EC 108 is realized as a processing circuit such as a one-chip microcontroller. A keyboard controller which controls an input device such as a keyboard (KB) may be incorporated into the EC 108.

In the information processing apparatus, the processor 101 executes the process as described below under the control of the host software (the application software layer 41, the OS 42, and the file system 43).

The processor 101 sends extended namespace management commands to the SSD 3, and creates namespace NS #1 (area 51) for hot data within the SSD 3. The extended namespace management command includes a parameter indicative of the number of physical blocks which should be allocated to namespace NS #1 (area 51) for hot data.

The processor 101 sends extended namespace management commands to the SSD 3, and creates namespace NS #2 (area 52) for warm data within the SSD 3. The extended namespace management command includes a parameter indicative of the number of physical blocks which should be allocated to namespace NS #2 (area 52) for warm data.

Similarly, the processor 101 sends extended namespace management commands to the SSD 3, and creates namespace NS # n (area 55) for cold data within the SSD 3. The extended namespace management command includes a parameter indicative of the number of physical blocks which should be allocated to namespace NS # n (area 55) for cold data.

The processor 101 manages the namespace ID of namespace NS #1 as the namespace ID for hot data, manages the namespace ID of namespace NS #2 as the namespace ID for warm data, and manages the namespace ID of namespace NS # n as the namespace ID for cold data.

When it is necessary to write a certain kind of hot data to the SSD 3, the processor 101 sends write commands including the namespace ID of namespace NS #1 to the SSD. When it is necessary to write a certain kind of cold data to the SSD 3, the processor 101 sends write commands including the namespace ID of namespace NS # n to the SSD.

Figure 31:
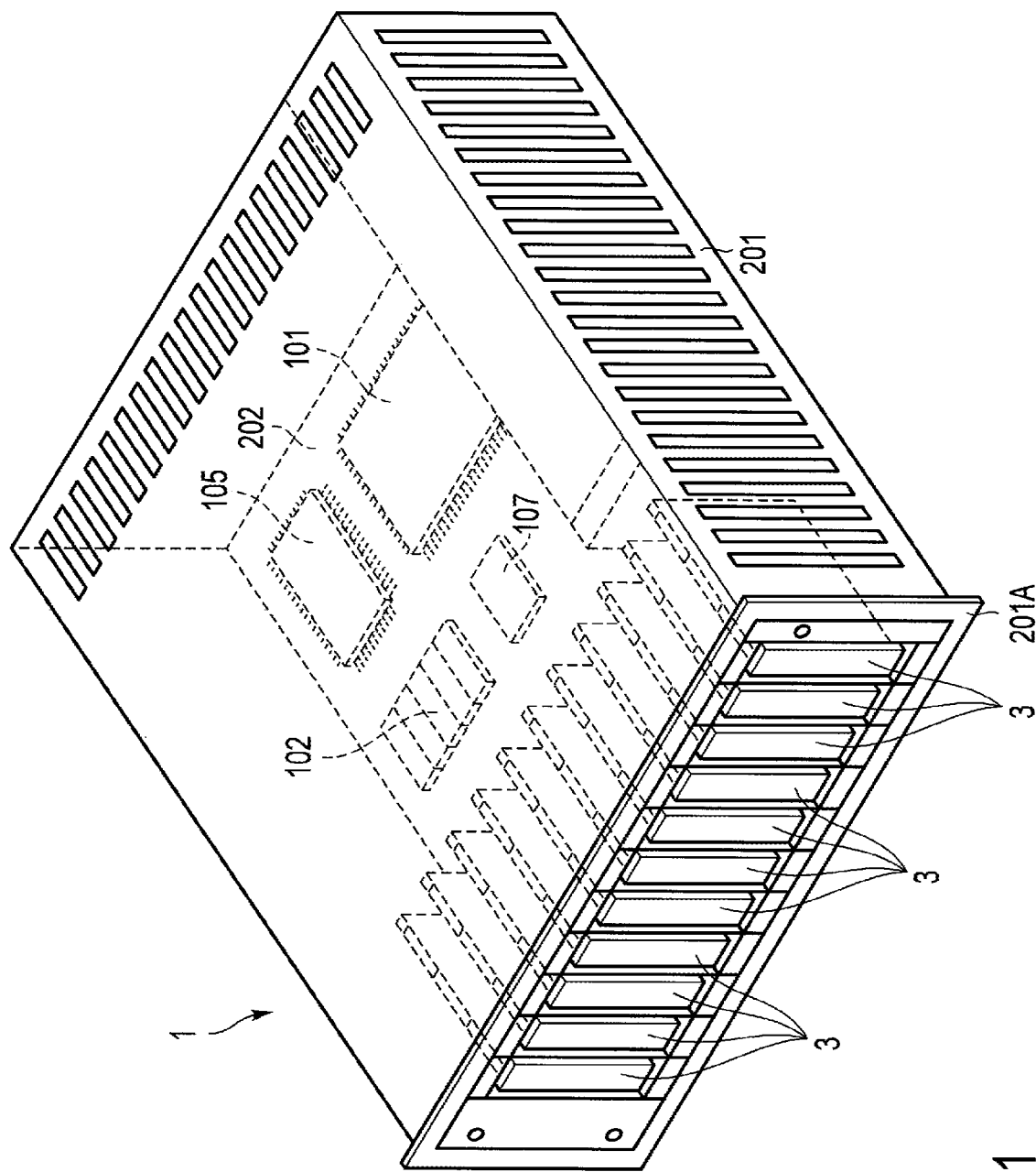
FIG. 31 is an illustration showing a configuration example of a computer including the memory system and the host of the embodiment.

FIG. 31 shows a configuration example of an information processing apparatus including a plurality of SSDs 3 and the host 2.

This information processing apparatus comprises a thin box-shaped housing 201 which can be accommodated in a rack. A number of SSDs 3 may be arranged within the housing 201. In this case, each of the SSDs 3 may be removably inserted into a slot provided in a front surface 201A of the housing 201.

A system board (a motherboard) 202 is arranged inside the housing 201. On the system board (motherboard) 202, various electronic components including the CPU 101, the memory 102, the network controller 105, and the controller 107 are mounted. These electronic components serve as the host 2.

As described above, according to the present embodiment, a plurality of namespaces (areas) for storing several kinds of data are managed, and based on a request from the host 2 specifying the amount of physical resources (the number of physical blocks) to be secured for each of the namespaces, a specified number of physical blocks are allocated individually as the physical resources for these namespaces. Accordingly, by considering the capacity and the frequency of update of each of the several kinds of data, physical blocks can be easily and optimally allocated to individual namespaces (areas). Thus, since endurance appropriate for the frequency of update of data to be stored can be realized for each of the namespaces (areas), and write amplification of a namespace (area) for data whose frequency of update is high can be reduced, the life of an SSD can be extended to maximum.

In other words, according to the present embodiment, it is possible to flexibly perform the control of securing a large amount of over-provision area for a namespace (area) for data whose frequency of update is high, and securing a small amount of over-provision area for a namespace (area) for data whose frequency of update is low. In this way, since it becomes possible to reduce the write amplification of a namespace (area) for data whose frequency of update is high, the life of an SSD can be extended to maximum.

In the present embodiment, a NAND memory has been exemplified as a nonvolatile memory. However, the function of the present embodiment can also be applied to other various nonvolatile memories, such as a magnetoresistive random access memory (MRAM), a phase-change random access memory (PRAM), a resistive random access memory (ReRAM), or a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host device, comprising:
a nonvolatile memory including a plurality of physical blocks; and
a controller electrically connected to the nonvolatile memory and configured to manage a plurality of namespaces, the controller being configured to:
receive a first request to create a first namespace from the host device, the first request including a first parameter and a second parameter, the first parameter indicative of a first number of logical addresses, the second parameter indicative of a first number of physical blocks to be allocated for the first namespace or a second number of physical blocks to be allocated for a first over-provision area for the first namespace;
in response to receiving the first request and prior to writing data to the first namespace, allocate a third number of physical blocks, wherein (i) when the second parameter indicates the first number of physical blocks to be allocated for the first namespace, a memory capacity of the first over-provision area for the first namespace is defined as a difference between a memory capacity of the first number of logical addresses and a memory capacity of the first number of physical blocks, and (ii) when the second parameter indicates the second number of physical blocks to be allocated for the first over-provision area for the first namespace, the memory capacity of the first over-provision area is defined as a memory capacity of the second number of physical blocks; and
write data associated with the first namespace to the first namespace after allocating the third number of physical blocks,
wherein the first over-provision area for the first namespace is not visible to the host device as a user accessible logical address space, and
wherein a memory capacity of the third number of physical blocks allocated is greater than the memory capacity of the first number of logical addresses.

2. The memory system according to claim 1, wherein the controller is configured to write data associated with an ID of the first namespace to the first namespace.

3. The memory system according to claim 1, wherein the controller is configured to:
receive a second request to create a second namespace from the host device, the second request including a third parameter and a fourth parameter, the third parameter indicative of a second number of logical addresses, the fourth parameter indicative of a fourth number of physical blocks to be allocated for the second namespace or a fifth number of physical blocks to be allocated for a second over-provision area for the second namespace;
in response to receiving the second request and prior to writing data to the second namespace, allocate a sixth number of physical blocks, wherein (i) when the fourth parameter indicates the fourth number of physical blocks to be allocated for the second namespace, a memory capacity of the second over-provision area for the second namespace is defined as a difference between a memory capacity of the second number of logical addresses and a memory capacity of the fourth number of physical blocks, and (ii) when the fourth parameter indicates the fifth number of physical blocks to be allocated for the second over-provision area for the second namespace, the memory capacity of the second over-provision area is defined as a memory capacity of the fifth number of physical blocks; and
write data associated with the second namespace to the second namespace after allocating the sixth number of physical blocks,
wherein the second over-provision area for the second namespace is not visible to the host device as a user accessible logical address space, and
wherein a memory capacity of the sixth number of physical blocks allocated is greater than the memory capacity of the fourth number of logical addresses.

4. The memory system according to claim 3, wherein the controller is configured to:
determine whether or not allocation of the physical blocks whose number is specified by each request is possible, on the basis of the number of remaining physical blocks of the nonvolatile memory; and
notify, when the allocation of the physical blocks whose number is specified by each request is not possible, the host device of an error response.

5. The memory system according to claim 1, wherein the controller is configured to:
calculate write amplification of the first namespace by counting an amount of data written to the first namespace by the host device, and an amount of data written to the first namespace by a garbage collection operation of the first namespace; and provide the write amplification corresponding to the first namespace to the host device.

6. The memory system according to claim 1, wherein the controller is configured to:
receive a control command requesting starting of garbage collection of a target namespace from the host device;
select target physical blocks, which are to be garbage-collected, from physical blocks for the target namespace; and
execute a garbage collection operation of copying valid data from the target physical blocks to a copy destination free block.

7. The memory system of according to claim 6, wherein the controller is configured to:
manage free blocks created by the garbage collection operation executed for each of the namespaces as shared free blocks of the plurality of namespaces;
select a free block having a least number of program/erase cycles from the shared free blocks; and
allocate the selected free block as the copy destination free block for the target namespace.

8. The memory system of according to claim 1, wherein the controller is configured to execute a striping operation for distributing data across a plurality of storage devices each including the nonvolatile memory, and
each of the plurality of namespaces is arranged to extend over the plurality of storage devices.

9. A method of controlling a nonvolatile memory including a plurality of physical blocks, the method comprising:
managing a plurality of namespaces;
receiving a first request to create a first namespace from a host device, the first request including a first parameter and a second parameter, the first parameter indicative of a first number of logical addresses, the second parameter indicative of a first number of physical blocks to be allocated for the first namespace or a second number of physical blocks to be allocated for a first over-provision area for the first namespace;

in response to receiving the first request and prior to writing data to the first namespace, allocating a third number of physical blocks, wherein (i) when the second parameter indicates the first number of physical blocks to be allocated for the first namespace, a memory capacity of the first over-provision area for the first namespace is defined as a difference between a memory capacity of the first number of logical addresses and a memory capacity of the first number of physical blocks, and (ii) when the second parameter indicates the second number of physical blocks to be allocated for the first over-provision area for the first namespace, the memory capacity of the first over-provision area is defined as a memory capacity of the second number of physical blocks; and writing data associated with the first namespace to the first namespace after allocating the third number of physical blocks, wherein the first over-provision area for the first namespace is not visible to the host device as a user accessible logical address space, and wherein a memory capacity of the third number of physical blocks allocated is greater than the memory capacity of the first number of logical addresses.

10. The method according to claim 9, further comprising writing data associated with an ID of the first namespace to the first namespace.

11. The method according to claim 9, further comprising:
receiving a second request to create a second namespace from the host device, the second request including a third parameter and a fourth parameter, the third parameter indicative of a second number of logical addresses, the fourth parameter indicative of a fourth number of physical blocks to be allocated for the second namespace or a fifth number of physical blocks to be allocated for a second over-provision area for the second namespace;

in response to receiving the second request and prior to writing data to the second namespace, allocating a sixth number of physical blocks, wherein (i) when the fourth parameter indicates the fourth number of physical blocks to be allocated for the second namespace, a memory capacity of the second over-provision area for the second namespace is defined as a difference between a memory capacity of the second number of logical addresses and a memory capacity of the fourth number of physical blocks, and (ii) when the fourth parameter indicates the fifth number of physical blocks to be allocated for the second over-provision area for the second namespace, the memory capacity of the second over-provision area is defined as a memory capacity of the fifth number of physical blocks; and writing data associated with the second namespace to the second namespace after allocating the sixth number of physical blocks, wherein the second over-provision area for the second namespace is not visible to the host device as a user accessible logical address space, and wherein a memory capacity of the sixth number of physical blocks allocated is greater than the memory capacity of the fourth number of logical addresses.

12. The method according to claim 11, further comprising:
determining whether or not allocation of the physical blocks whose number is specified by each request is possible, on the basis of the number of remaining physical blocks of the nonvolatile memory; and notifying, when the allocation of the physical blocks whose number is specified by each request is not possible, the host device of an error response.

13. The method according to claim 9, further comprising:
receiving a control command requesting starting of garbage collection of a target namespace from the host device;

selecting target physical blocks, which are to be garbage-collected, from physical blocks for the target namespace; and executing a garbage collection operation of copying valid data from the target physical blocks to a copy destination free block.

14. The method according to claim 13, further comprising:
managing free blocks created by the garbage collection operation executed for each of the namespaces as shared free blocks of the plurality of namespaces;

selecting a free block having a least number of program/erase cycles from the shared free blocks; and allocating the selected free block as the copy destination free block for the target namespace.

15. The method according to claim 9, further comprising executing a striping operation for distributing data across a plurality of storage devices each including the nonvolatile memory, wherein each of the plurality of namespaces is arranged to extend over the plurality of storage devices.

* * * * *